US012810039B2

(12) United States Patent
Pidaparthi et al.

(10) Patent No.: US 12,810,039 B2
(45) Date of Patent: Nov. 24, 2026

(54) PHYSICS ENGINE BASED EVALUATION OF PALLET STABILITY

(71) Applicant: Dexterity, Inc., Redwood City, CA (US)

(72) Inventors: Rohit Arka Pidaparthi, Mountain View, CA (US); William Arthur Clary, Palo Alto, CA (US); Neeraja Abhyankar, Menlo Park, CA (US); Jonathan Kuck, Palo Alto, CA (US); Ben Varkey Benjamin Pottayil, Foster City, CA (US); Kevin Jose Chavez, Redwood City, CA (US); Shitij Kumar, Redwood City, CA (US)

(73) Assignee: Dexterity, Inc., Redwood City, CA (US)

( * ) Notice: Subject to any disclaimer, the term of this patent is extended or adjusted under 35 U.S.C. 154(b) by 1064 days.

(21) Appl. No.: 17/837,787

(22) Filed: Jun. 10, 2022

(65) Prior Publication Data

US 2022/0405439 A1 Dec. 22, 2022

Related U.S. Application Data

(60) Provisional application No. 63/211,375, filed on Jun. 16, 2021.

(51) Int. Cl.
*G06F 30/20* (2020.01)

(52) U.S. Cl.
CPC .................................... *G06F 30/20* (2020.01)

(58) Field of Classification Search
CPC ..................... G06F 30/20; G06F 30/17; G05B 2219/40006; G05B 2219/40323; B25J 9/1687; B25J 9/1689; B65G 61/00
See application file for complete search history.

(56) References Cited

U.S. PATENT DOCUMENTS

| | | | |
|---|---|---|---|
| 4,641,271 | A | 2/1987 | Konishi |
| 4,692,876 | A | 9/1987 | Tenma |

(Continued)

FOREIGN PATENT DOCUMENTS

| | | |
|---|---|---|
| CN | 107000208 | 8/2017 |
| CN | 109421071 | 3/2019 |

(Continued)

OTHER PUBLICATIONS

Balakirsky, Stephen, et al. "Using simulation to assess the effectiveness of pallet stacking methods." International Conference on Simulation, Modeling, and Programming for Autonomous Robots. Berlin, Heidelberg: Springer Berlin Heidelberg, 2010. (Year: 2010).*

(Continued)

*Primary Examiner* — Chuen-Meei Gan
(74) *Attorney, Agent, or Firm* — Van Pelt, Yi & James LLP

(57) ABSTRACT

A robotic system is disclosed. The system includes a memory configured to store for each of a plurality of items a set of attribute values representing one or more physical attributes of the item. The system includes one or more processors coupled to the communication interface and configured to use the attribute values as inputs to a physic engine configured to compute the stability of a simulated stack of items comprising at least a subset of the plurality of items.

22 Claims, 12 Drawing Sheets

(56) References Cited

U.S. PATENT DOCUMENTS

| | | | |
|---|---|---|---|
| 5,175,692 | A | 12/1992 | Mazouz |
| 5,501,571 | A | 3/1996 | Van Durrett |
| 5,908,283 | A | 6/1999 | Huang |
| 5,920,480 | A | 7/1999 | Nakamura |
| 6,055,462 | A | 4/2000 | Sato |
| 7,266,422 | B1 | 9/2007 | DeMotte |
| 7,644,052 | B1 | 1/2010 | Chang |
| 8,290,617 | B2 | 10/2012 | Ruge |
| 8,504,413 | B1 | 8/2013 | Rowe |
| 9,079,305 | B2 | 7/2015 | Williamson |
| 9,102,055 | B1 | 8/2015 | Konolige |
| 9,227,323 | B1 | 1/2016 | Konolige |
| 9,315,344 | B1 | 4/2016 | Lehmann |
| 9,387,589 | B2 | 7/2016 | Barajas |
| 9,600,798 | B2 | 3/2017 | Battles |
| 9,682,481 | B2 | 6/2017 | Lutz |
| 9,802,317 | B1 | 10/2017 | Watts |
| 9,866,815 | B2 | 1/2018 | Vrcelj |
| 9,926,138 | B1 | 3/2018 | Brazeau |
| 10,169,677 | B1 | 1/2019 | Ren |
| 10,252,870 | B2 | 4/2019 | Kimoto |
| 10,335,947 | B1 | 7/2019 | Diankov |
| 10,456,915 | B1 | 10/2019 | Diankov |
| 10,540,821 | B2 | 1/2020 | Musunuri |
| 10,549,928 | B1 | 2/2020 | Chavez |
| 10,576,630 | B1 | 3/2020 | Diankov |
| 10,618,172 | B1 | 4/2020 | Diankov |
| 10,647,528 | B1 | 5/2020 | Diankov |
| 10,679,379 | B1 | 6/2020 | Diankov |
| 10,696,493 | B1 | 6/2020 | Diankov |
| 10,696,494 | B1 | 6/2020 | Diankov |
| 10,722,992 | B2 | 7/2020 | Wada |
| 10,786,899 | B2 | 9/2020 | Kimoto |
| 10,953,549 | B2 | 3/2021 | Diankov |
| 10,984,378 | B1 | 4/2021 | Eckman |
| 11,020,854 | B2 | 6/2021 | Kanunikov |
| 11,077,554 | B2 | 8/2021 | Arase |
| 11,244,441 | B1 | 2/2022 | Jeanes |
| 11,305,431 | B2 | 4/2022 | Ghazaei Ardakani |
| 11,319,166 | B2 | 5/2022 | Diankov |
| 11,472,640 | B2 | 10/2022 | Diankov |
| 11,488,323 | B2 | 11/2022 | Diankov |
| 11,591,168 | B2 | 2/2023 | Diankov |
| 11,591,169 | B2 | 2/2023 | Chavez |
| 11,794,346 | B2 | 10/2023 | Diankov |
| 11,905,115 | B2 | 2/2024 | Sun |
| 11,932,501 | B2 | 3/2024 | Hau |
| 12,157,231 | B2 | 12/2024 | Kanunikov |
| 12,162,704 | B2 | 12/2024 | Mccalib, Jr. |
| 12,390,928 | B2 | 8/2025 | Pidaparthi |
| 2004/0165980 | A1 | 8/2004 | Huang |
| 2005/0246056 | A1 | 11/2005 | Marks |
| 2008/0131255 | A1 | 6/2008 | Hessler |
| 2009/0069939 | A1 | 3/2009 | Nagatsuka |
| 2010/0178149 | A1 | 7/2010 | Fritzsche |
| 2010/0222915 | A1 | 9/2010 | Kuehnemann |
| 2010/0249989 | A1 | 9/2010 | Baldes |
| 2011/0122231 | A1 | 5/2011 | Fujieda |
| 2011/0231016 | A1 | 9/2011 | Goulding |
| 2013/0231778 | A1 | 9/2013 | Østergaard |
| 2013/0233116 | A1 | 9/2013 | Rose |
| 2013/0282165 | A1 | 10/2013 | Pankratov |
| 2014/0012415 | A1 | 1/2014 | Benaim |
| 2014/0343910 | A1* | 11/2014 | Zheng ..................... G06F 30/20 703/6 |
| 2015/0073588 | A1 | 3/2015 | Priebe |
| 2016/0016311 | A1 | 1/2016 | Konolige |
| 2016/0221187 | A1 | 8/2016 | Bradski |
| 2016/0272354 | A1 | 9/2016 | Nammoto |
| 2016/0355337 | A1 | 12/2016 | Lert |
| 2017/0043953 | A1 | 2/2017 | Battles |
| 2017/0246744 | A1 | 8/2017 | Chitta |
| 2017/0267467 | A1 | 9/2017 | Kimoto |
| 2018/0060765 | A1 | 3/2018 | Hance |
| 2018/0065818 | A1 | 3/2018 | Gondoh |
| 2018/0086572 | A1 | 3/2018 | Kimoto |
| 2018/0162660 | A1 | 6/2018 | Saylor |
| 2018/0304468 | A1 | 10/2018 | Holz |
| 2019/0016543 | A1 | 1/2019 | Turpin |
| 2019/0061151 | A1 | 2/2019 | Namiki |
| 2019/0091728 | A1 | 3/2019 | Stratton |
| 2019/0143504 | A1 | 5/2019 | Kimoto |
| 2019/0193956 | A1 | 6/2019 | Morland |
| 2019/0194005 | A1 | 6/2019 | Shah |
| 2019/0213291 | A1 | 7/2019 | Higuchi |
| 2020/0094997 | A1 | 3/2020 | Menon |
| 2020/0101611 | A1 | 4/2020 | Ramanujam |
| 2020/0130936 | A1 | 4/2020 | Shekhawat |
| 2020/0130961 | A1 | 4/2020 | Diankov |
| 2020/0171653 | A1 | 6/2020 | Holson |
| 2020/0270071 | A1 | 8/2020 | Chavez |
| 2020/0376662 | A1 | 12/2020 | Arase |
| 2020/0376670 | A1 | 12/2020 | Diankov |
| 2020/0377311 | A1 | 12/2020 | Diankov |
| 2020/0377312 | A1 | 12/2020 | Diankov |
| 2020/0377315 | A1 | 12/2020 | Diankov |
| 2020/0380722 | A1 | 12/2020 | Diankov |
| 2020/0398441 | A1 | 12/2020 | Marchese |
| 2021/0004344 | A1 | 1/2021 | Cohen |
| 2021/0023719 | A1 | 1/2021 | Alt |
| 2021/0053216 | A1 | 2/2021 | Diankov |
| 2021/0096543 | A1 | 4/2021 | Stump |
| 2021/0096553 | A1 | 4/2021 | Stump |
| 2021/0129333 | A1* | 5/2021 | Kanunikov ............ B25J 9/1666 |
| 2021/0129334 | A1 | 5/2021 | Kanunikov |
| 2021/0139256 | A1 | 5/2021 | Fu |
| 2021/0170596 | A1 | 6/2021 | Diankov |
| 2021/0201221 | A1 | 7/2021 | Abraham |
| 2021/0214163 | A1 | 7/2021 | Deacon |
| 2021/0216767 | A1 | 7/2021 | Yu |
| 2021/0237274 | A1* | 8/2021 | Diankov ................ B25J 9/1676 |
| 2021/0312393 | A1 | 10/2021 | Stump |
| 2022/0219916 | A1 | 7/2022 | Diankov |
| 2022/0222623 | A1 | 7/2022 | Stump |
| 2022/0288787 | A1 | 9/2022 | Dupree |
| 2022/0297958 | A1 | 9/2022 | Moreno |
| 2022/0402133 | A1 | 12/2022 | Pidaparthi |
| 2022/0402134 | A1 | 12/2022 | Pidaparthi |
| 2022/0402708 | A1 | 12/2022 | Pidaparthi |
| 2022/0402709 | A1 | 12/2022 | Pidaparthi |
| 2022/0402710 | A1 | 12/2022 | Pidaparthi |
| 2023/0016733 | A1 | 1/2023 | Diankov |
| 2023/0044420 | A1 | 2/2023 | Abouelela |
| 2023/0098524 | A1 | 3/2023 | Tiwari |
| 2023/0124552 | A1 | 4/2023 | Sarkar |
| 2023/0278811 | A1 | 9/2023 | Diankov |
| 2024/0300104 | A1 | 9/2024 | Moreno |
| 2024/0394643 | A1 | 11/2024 | Kristensen |
| 2025/0010481 | A1 | 1/2025 | Neeraja |
| 2025/0091270 | A1 | 3/2025 | Horie |
| 2025/0214788 | A1 | 7/2025 | Felip Leon |
| 2025/0381661 | A1 | 12/2025 | Sun |
| 2026/0008619 | A1 | 1/2026 | Tiwary |

FOREIGN PATENT DOCUMENTS

| | | |
|---|---|---|
| CN | 110769985 | 2/2020 |
| CN | 112507820 | 3/2021 |
| CN | 112589791 | 4/2021 |
| CN | 112775960 | 5/2021 |
| DE | 102010022357 | 7/2014 |
| DE | 102020114577 | 5/2022 |
| JP | 6771799 | 10/2020 |
| JP | 2020196624 | 12/2020 |
| JP | 7362755 | 10/2023 |
| TW | 201914782 | 4/2019 |
| TW | 202040502 | 11/2020 |
| TW | 202113706 | 4/2021 |

OTHER PUBLICATIONS

Verma et al. A Generalized Reinforcement Learning Algorithm for Online 3D Bin-Packing . Jul. 1, 2020.

(56) References Cited

OTHER PUBLICATIONS

Braunl et al. "Fault-Tolerant Robot Programming through Simulation with Realistic Sensor Models." In: Sage Journals, Jun. 1, 2006, [online] [retrieved on Sep. 27, 2022 (Sep. 27, 2022)] Retrieved from the Internet< URL: https://journals.sagepub.com/doi/10.5772/5750>, entire document.
Verma et al. "A Generalized Reinforcement Learning Algorithm for Online 3D Bin-Packing." In: Cornell University Library/Computer Science / Artificial Intelligence, Jul. 1, 2020, [online] [retrieved on Sep. 28, 2022 (Sep. 28, 2022)] Retrieved from the Internet < URL: https://arxiv.org/abs/2007.00463 >, entire document.
Schuster et al: "Stable Stacking for the Distributor's Pallet Packing Problem", Intelligent Robots and Systems (IROS), 2010 IEEE/RSJ International Conference on, IEEE, Piscataway, NJ, USA, Oct. 18, 2010 (Oct. 18, 2010), pp. 3646-3651, XP031888390, DOI: 10.1109/IROS.2010.5650217 ISBN: 978-1-4244-6674-0.
Balakirsky et al. 'Using Simulation to Assess the Effectiveness of Pallet Stacking Methods', Nov. 31, 2010 (Nov. 31, 2010), [online], retrieved from <URL: https://www.researchgate.net/publication/220850165_Using_Simulation_to_Assess_the_Effectiveness_of_Pallet_Stacking_Methods>, entire document.
Raaj et al., Precise Measurement of Carbo Boxes for Gantry Robot Palletization in Large Scale Workspaces Using Low-Cost RGB-D Sensors, ACCV, Part IV, LNCS 10114, pp. 472-486, DOI: 10.1007/978-3-319-54190-7_29. March. 12, 2017.

* cited by examiner

200

300

800

815

860

875

890

900

PHYSICS ENGINE BASED EVALUATION OF PALLET STABILITY

CROSS REFERENCE TO OTHER APPLICATIONS

This application claims priority to U.S. Provisional Patent Application No. 63/211,375 entitled PHYSICS ENGINE BASED EVALUATION OF PALLET STABILITY filed Jun. 16, 2021 which is incorporated herein by reference for all purposes.

BACKGROUND OF THE INVENTION

Shipping and distribution centers, warehouses, shipping docks, air freight terminals, big box stores, and other activities that ship and receive non-homogeneous sets of items use strategies such as packing and unpacking dissimilar items in boxes, crates, containers, conveyor belts, and on pallets, etc. Packing dissimilar items in boxes, crates, on pallets, etc. enables the resulting sets of items to be handled by heavy lifting equipment, such as forklifts, cranes, etc., and enables items to be packed more efficiently for storage (e.g., in a warehouse) and/or shipment (e.g., in truck, cargo hold, etc.).

In some contexts, items may be so dissimilar in size, weight, density, bulkiness, rigidity, strength of packaging, etc. that any given item or set of items may or may not have attributes that would enable those items to support the size, weight, distribution of weight, etc., of a given other item that might be required to be packed (e.g., in a box, container, pallet, etc.). When assembling a pallet or other set of dissimilar items, items must be selected and stacked carefully to ensure the palletized stack does not collapse, lean, or otherwise become unstable (e.g., so as not to be able to be handled by equipment such as a forklift, etc.) and to avoid item damage.

Currently, pallets typically are stacked and/or unpacked by hand. Human workers select items to be stacked, e.g., based on a shipping invoice or manifest, etc., and use human judgment and intuition to select larger and heavier items to place on the bottom, for example. However, in some cases, items simply arrive via a conveyor or other mechanism and/or are selected from bins in an ordered list, etc., resulting in an unstable palletized or otherwise packed set.

Use of robotics is made more challenging in many environments due to the variety of items, variations in the order, number, and mix of items to be packed, on a given pallet for example, and a variety of types and locations of container and/or feed mechanisms from which items must be picked up to be placed on the pallet or other container.

BRIEF DESCRIPTION OF THE DRAWINGS

Various embodiments of the invention are disclosed in the following detailed description and the accompanying drawings.

DETAILED DESCRIPTION

Figure 1:
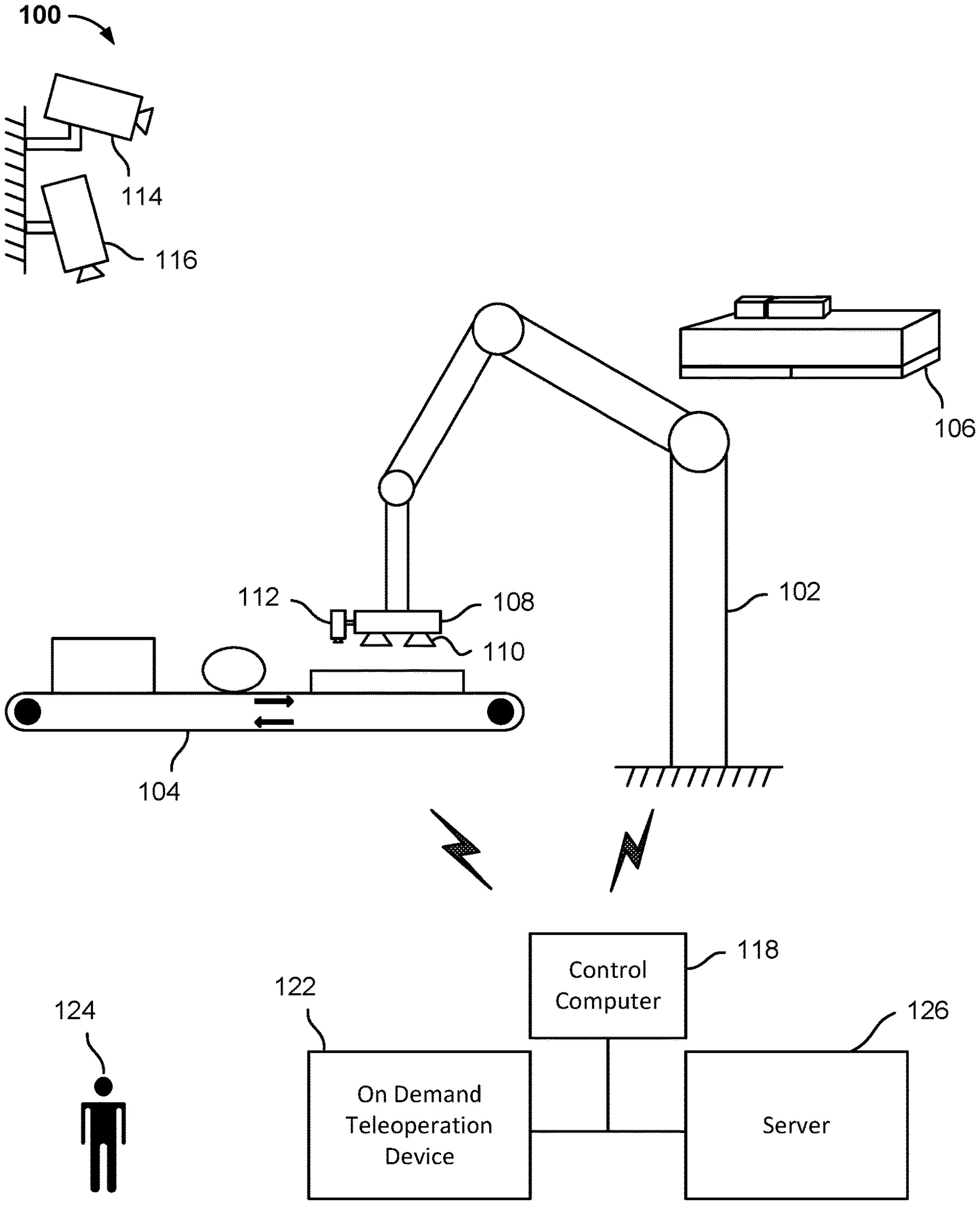
FIG. 1 is a diagram illustrating a robotic system to palletize and/or depalletize heterogeneous items according to various embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As used herein, a geometric model may mean a model of a state of a workspace such as a programmatically determined state. For example, the geometric model is generated using geometric data determined in connection with generating a plan to move an item in the workspace and an expected result if the item was moved according to plan. For example, a geometric model corresponds to a state of a workspace that is modified by controlling a robotic arm to pick, move, and/or place items within the workspace, and the picking, moving, and placing of the item is deemed to be performed according to plan (e.g., without error such as error or noise that may be introduced based on (i) a mis-configuration or mis-alignment of the robotic arm or another component in the workspace, (ii) a deforming of the item based on interaction with the robotic arm, (iii) another item in the workspace, another object in the workspace, (iv) a collision between the robotic arm, or item being moved by the robotic arm, and another object in the workspace, etc.).

As used herein, "pallet" includes a platform, receptacle, or other container on, or in, which one or more items may be stacked or placed. Further, as used herein, the pallet may be used in connection with packaging and distributing a set of one or more items. As an example, the term pallet includes the typical flat transport structure that supports items and that is movable via a forklift, a pallet jack, a crane, etc. A pallet, as used herein, may be constructed of various materials including, wood, metals, metal alloys, polymers, etc.

As used herein, palletization of an item or a set of items includes picking an item from a source location, such as a conveyance structure, and placing the item on a pallet such as on a stack of items on the pallet.

As used herein, depalletization includes picking an item from a pallet, such as from a stack of items on the pallet, moving the item, and placing the item at a destination location such as a conveyance structure. An example of a palletization/depalletization system and/or process for palletizing/de-palletizing a set of items is further described in U.S. patent application Ser. No. 17/343,609, the entirety of which is hereby incorporated herein for all purposes.

As used herein, singulation of an item includes picking an item from a source pile/flow and placing the item on a conveyance structure (e.g., a segmented conveyor or similar conveyance). Optionally, singulation may include sortation of the various items on the conveyance structure such as via singly placing the items from the source pile/flow into a slot or tray on the conveyor. An example of a singulation system and/or process for singulating a set of items is further described in U.S. patent application Ser. No. 17/246,356, the entirety of which is hereby incorporated herein for all purposes.

As used herein, kitting includes the picking of one or more items/objects from corresponding locations and placing the one or more items in a predetermined location in a manner that a set of the one or more items corresponds to a kit. An example of a kitting system and/or process for kitting a set of items is further described in U.S. patent application Ser. No. 17/219,503, the entirety of which is hereby incorporated herein for all purposes.

As used herein, a scoring function can include a predefined function based at least in part on one or more of (i) an expected stability of the stack of items, (ii) a time for completion of the stack of items, (iii) a satisfaction of whether the stack of items satisfies a predefined criteria or heuristic (e.g., deformable members placed towards the top of the stack, heavy items placed towards the bottom of the stack, irregularly shaped items placed towards the top of the stack, etc.), (iv) collision avoidance or an expected collision (e.g., a determination of whether a trajectory to the placement location would lead to a collision between the item or robotic arm and another), (v) an efficiency of moving the item(s), and (vi) an indication of whether the robot is expected to be configured in an awkward pose when picking, moving, or placing the item for the placement.

As used herein, a vision system includes one or more sensors that obtain sensor data, for example, sensor data pertaining to a workspace. Sensors may include one or more of a camera, a high-definition camera, a 2D camera, a 3D (e.g., RGBD) camera, an infrared (IR) sensor, other sensors to generate a three-dimensional view of a workspace (or part of a workspace such as a pallet and stack of items on the pallet), any combination of the foregoing, and/or a sensor array comprising a plurality of sensors of the foregoing, etc. An example of a vision system is further described in U.S. patent application Ser. No. 16/667,661, the entirety of which is hereby incorporated herein for all purposes.

Various embodiments include a system, device, or method for evaluating a stack of items, such as a simulated stack of items or an estimated state or digital model of a real-world stack of items. The system stores for each of a plurality of items a set of attribute values representing one or more physical attributes of the item and uses the attribute values as inputs to a physic engine configured to compute the stability of a simulated stack of items comprising at least a subset of the plurality of items.

The system for evaluating a stack of items, such as a simulated stack of items can be implemented locally at a robotic system that controls a robotic arm to pick and place items, or remotely at a server. In the case that the system for evaluating a stack of items is implemented remotely on one or more servers, the one or more servers provide a service (e.g., a remote service) to one or more robotic systems. Implementing the system for evaluating the stack of items as a service called by a robotic system may be more efficient and reduce latency associated with determining a plan to move an item and picking and placing the item in accordance the plan.

In some embodiments, the system for evaluating the stack of items is a physics engine that model/simulates interactions of objects in the real world. The physics engine simulates the interaction among items in the stack of items or other objects within the workspace. For example, the physics engine takes into account all the interactions among the items and/or objects within the workspace, such as item-to-item interactions (e.g., a multi-body simulation is performed with respect to a set of items with various items having various characteristics), item-to-robotic arm interactions, forklift-to-pallet interactions, etc. The physics engine uses parameters that model the properties of items to emulate the items in the real-world. According to various embodiments, the physics engine is determined based on comparing real-world stacks of items to the parameters to generalize (or train relationships) with respect to interactions among items in the stack of items and/or other objects in the workspace. Examples of dynamic parameters used by the physics engine include (i) friction, (ii) contact damping, (iii) restitution, (iv) stiffness, etc. Various other parameters may be implemented. In some embodiments, the physics engine further models the pallet, walls in the environment (e.g., warehouse or truck, etc.), a floor in the environment, etc.

In some embodiments, a machine learning process is implemented to train the physics engine. For example, the system uses a training set corresponding to real-world stacks of items and corresponding interactions among the stack of items or other objects in the workspace, and the system trains the physics engine based on the training set.

In some embodiments, the system for evaluating the stack of items (e.g., the physics engine) simulates forces acting on the stack of items. The system can simulate various types of external forces and/or external forces having various magnitudes. Examples of types of forces that the system can simulate include (i) a friction force (e.g., between two items, etc.), (ii) gravity, (iii) a normal force, (iv) a shaking force, (v) sway forces generated during movement of an item, (vi) a force corresponding to a forklift engaging a pallet on which the stack of items is stacked, etc. Various other types of forces can be simulated. The simulation of external forces can be implemented in accordance with a predefined force profile, including a definition/characteristics of the force to be simulated. The force profile can include one or more of a type of force, a magnitude of the force, a location at which force is applied, etc. In some implementations, the force profile is set based on a user input, such as a request input by a user via a client system for the system to simulate a particular external force. As an example, a user requests the system to simulate a force generated as a forklift (or other vehicle/device) picking up and/or moving a pallet on which the stack of items is stacked. In some implementations, the force profile is set, or referenced by, a scenario to be simulated.

In some embodiments, the evaluating the stack of items includes simulating adversarial scenarios, such as simulating shaking of the pallet base to speed up destabilization and to evaluate the stability. The simulating the adversarial scenarios can include selecting an amount of force to be applied and a time period over which the force is to be simulated (e.g., how long the stack of items is shaken).

In some embodiments, evaluating a stack of items is based on a representation of a stack of items (e.g., an estimated state/geometric model), attributes for one or more items (e.g., if such attributes are not included in the geometric model), and a scoring function for determining a score (e.g., a value for goodness, stability, density, etc.) of the stack of items. The evaluating the stack of items may be further based on a force profile for a force to be simulated (e.g., force profiles for one or more forces to be simulated according to a predefined scenario or based on a user request to simulate an external force).

The system calls the physics engine to simulate an interaction between a particular and a stack of items (or other object in the workspace), such as in the context of a robotic arm being controlled (or to be controlled) to place the particular item in a particular location among the stack of items. The physics engine can model the stack of items after the placement of the particular item to assess whether the placement is feasible or otherwise results in a stable stack of items. For example, the system uses the physics engine to determine a stability of the stack of items after placement of the particular item. As another example, the system uses the physics engine to determine whether the particular item, or another item from the stack of items, has fallen off the stack of items. As another example, the system uses the physics engine to determine a score/value for the resulting stack of items in accordance with a predefined scoring function (e.g., a function based on one or more of stability, density, cost for corresponding placement, a time to complete the placement, etc.).

In connection with simulating placements of items, the system stores information pertaining to a placement in response to the simulation of the placement. For example, for each simulated placement, the system updates a geometric model of the workspace (e.g., a geometric model of the simulated stack of items). In connection with simulating a first placement of a set of placements to be simulated, the system obtains an estimated state for the stack of items. The system uses a state estimator (e.g., a state estimation model) to determine the estimated state (e.g., geometric model for the stack of items). The system then sequentially simulates placement of one or more items and updating the geometric model for the stack of items with each placement. The placements within the set of placements can be determined based on a placement model that determines possible/feasible placements and selects placements, from among the possible placements, to be simulated. The system (e.g., physics engine) can model/simulate a shifting of initial positions and orientations of items among the stack of items as the stack of items is built (e.g., as further placements are made to the stack of items). The system can evaluate the stability or other characteristics of the stability based on the modeled/simulated shifting of location(s)/orientation(s) of items included in the stack of items. In some embodiments, the system evaluates, for every item included in the stack of items (e.g., on the pallet) a modeled/simulated shift in location and orientation of such item for each placement of a set of items to be placed.

According to various embodiments, a physics engine is implemented in connection with evaluating (e.g., estimating) a stability of a pallet and/or a stack of items on the pallet. The physics engine may model the pallet and/or a stack of items to determine the stability of the pallet and/or a stack of items. In some embodiments, the physics engine may determine a value pertaining to a stability (or expected stability) of the pallet and/or a stack of items. The physics engine may determine that the pallet and/or a stack of items is, or is expected to be, stable or unstable based on a comparison of a value pertaining to a stability (or expected stability) to a predefined stability threshold and/or a confidence threshold (e.g., confidence indicating the certainty of the stability score).

In some embodiments, the predefined stability threshold is set based on a confidence interval associated with stability. For example, the predefined stability threshold may be set such that 95% of the time the pallet is stable and not subject to items falling from the stack, etc. As another example, the predefined stability threshold may be set such that 99% of the time the pallet is stable. The predefined stability threshold may be set by a user.

In some embodiments, the physics engine is used in connection with determining an expected stability of a pallet/stack of items, such as before an action is implemented. For example, before placing an item on a pallet (e.g., during palletization), the system uses the physics engine to evaluate an expected stability of placing an item at a particular location on the pallet. As another example, before removing an item from a pallet (e.g., during depalletization), the system uses the physics engine to evaluate an expected stability of removing the item from the pallet/stack of items. In response to a determination that the expected stability of a pallet/stack of items will be stable after performance of the action, the action may be performed or otherwise deemed to be an action that is a possible/permissible action. Conversely, in response to a determination that the expected stability of a pallet/stack of items will be not stable (or not sufficiently stable, such as less than a predetermined stability threshold) after performance of the action, the action may be performed or otherwise deemed to be an action that is a not possible/impermissible action.

In some embodiments, the physics engine is used in connection with determining a stability of a pallet/stack of items, such as after an action is implemented. For example, after placing an item on a pallet (e.g., during palletization), the system uses the physics engine to evaluate a stability in response to placing an item at a particular location on the pallet. As another example, after removing an item from a pallet (e.g., during depalletization), the system uses the physics engine to evaluate the stability of the pallet/stack of items remaining after removal of the item. In response to a determination that the stability of a pallet/stack of items is stable (e.g., exceeds a predetermined stability threshold), the system may deem the pallet/stack of items as stable and plan a subsequent action (e.g., place a next item, or remove a next item, etc.). Conversely, in response to a determination that the stability of a pallet/stack of items is not stable (or not sufficiently stable, such as less than a predetermined stability threshold), the system may deem the pallet/stack as unstable and the system may implement a remedial action (e.g., to improve the stability of the pallet/stack of items).

According to various embodiments, the system implements a remedial action (e.g., a responsive action) in response to a determination that the stability of a pallet/stack of items is not stable (or not sufficiently stable, such as less than a predetermined stability threshold). Examples of the remedial action include (i) providing an alert/indication to a user, (ii) requesting human intervention, (iii) determining and implementing a plan to remove an item from the pallet/stack of items that is causing the instability, (iv) determining and implementing a plan to add an item to the pallet/stack of items that is expected to improve the stability of the pallet/stack of items (e.g., improve the stability to exceed a predetermined stability threshold), (v) determining to wrap at least a part of the pallet and/or stack of items, (vi) using a spacer to improve stability among items, etc. Various other remedial actions may be performed. In some embodiments, one or more remedial actions may be implemented. The system may select one or more remedial actions to implement based at least in part on a likelihood (e.g., a measure of likelihood) that the one or more remedial actions may improve the stability, and/or an extent (e.g., a measure of the extent) to which the one or more remedial actions is expected to improve the stability. The system can cause the remedial action to be performed, such as control a robotic arm to perform a task, prompt a user for manual intervention, etc.

In some embodiments, the physics engine is comprised in a module loaded and/or executed by a computer system that controls the robot performing palletization/depalletization of a set of items. In some embodiments, the physics engine is comprised in a module loaded and/or executed by a remote system (e.g., a server). For example, the physics engine may be hosted as a service that is called by one or more robotic systems to evaluate stability or expected stability of a pallet and/or stack of items, etc.

The system may determine the stability or expected stability based at least in part on sensor data pertaining to the pallet and/or stack of items. As an example, the sensor data may be obtained by a vision system associated with the workspace in which the robot performing palletization/depalletization operates. In some embodiments, the physics engine determines, or obtains, a model of the pallet and/or stack of items. The model may be generated based at least in part on the sensor data. In some embodiments, the model comprises one or more attributes associated with one or more items on the pallet and/or stack of items. Examples of an attribute of an item include size (e.g., length, width, height, etc.), weight, center of gravity, type of packaging, a measure of rigidity, an indication of whether the item is rigid, an identifier (e.g., a barcode, label, etc.). Other attributes may be included in, or used in connection with determining, the model. According to various embodiments, the physics engine may determine a stability of the pallet and/or stack of items based at least in part on the model of the pallet and/or stack of items. As an example, the physics engine may determine a stability of the pallet and/or stack of items based on a position (or relative position) of one or more items on the pallet and/or stack of items, and at least one attribute of at least one item.

In some embodiments, the system determines that an item is to be placed on a pallet. In response to determining that the item is to be placed, the system may obtain/determine a current state of the pallet/stack of items, and determine a location at which to place the item. The determining of the location at which to place the item may comprise determining the possible locations at which the item may be placed, and determining a corresponding value of a scoring function associated with the pallet/stack of items if the item were to be placed at least at a subset of the possible locations. In response to determining the corresponding value of the scoring functions, the system determines a destination location at which to place the item based on the value of the scoring function associated with the destination location. In response to determining the destination location for the item, the system may determine a plan to move the item and place the item at the destination location. In response to determining the plan, the system may control a robot to implement the plan to move the item and place the item at the destination location. According to various embodiments, the system may iteratively perform the determining the destination location at which an item is to be placed for at least a plurality of a set of items to be picked and placed on the pallet (e.g., the set of items to be palletized). The system may also iteratively determine a plan to palletize an item and to control the robot to implement the plan to palletize the item for at least a plurality of the set of items.

In some embodiments, the determining the possible locations at which the item may be placed is based at least in part edges of the pallet/stack of items. For example, on the top surface of the pallet (e.g., before any items are placed on the pallet), the edges may correspond to the circumference of the pallet. As another example, on the top surface of the pallet (e.g., before any items are placed on the pallet), the edges may be determined based on the corners of the pallet. If one or more items have been placed on the pallet, a top surface of the stack may be uneven (e.g., non-planar). The possible locations at which the item may be placed may be determined based at least in part on the edges of one or more of (i) edges of the pallet, and (ii) one or more edges of one or more items on the pallet/stack of items. In some embodiments, the possible locations at which the item may be placed may be determined based at least in part on the edges of one or more of (i) edges of the pallet, and (ii) corners of at least two edges of one or more items on the pallet/stack of items. In some embodiments, if one or more items have already been placed on the pallet, then the possible locations on which the item may be placed may comprise one or more of (i) pallet, and (ii) one or more surfaces of layers formed by an item(s) placed on the pallet. The determining of the locations at which the item may be placed is based at least in part determining one or more edges corresponding to (e.g., defining) surfaces on which an item may be placed. For example, one or more edges may be determined for various layers or surfaces formed by items already placed on the pallet (e.g., a top surface of one or more of the items already placed on the pallet).

According to various embodiments, an edge may be determined based at least in part on a current model of the pallet. For example, a vision system corresponding to a workspace of the robot that palletizes items on a pallet may obtain information from which sensor data may be determined. The sensor data may be used in connection with generating a model of the pallet. For example, the model of the pallet may correspond to a current state of the pallet. In some embodiments, a system performs an analysis (e.g., an image analysis) on the model of the pallet. As an example, the system may perform an edge detection analysis to determine the edges in the model. The system may further process the model to determine edges corresponding to surfaces on which an item may be placed.

In some embodiments, a possible location is determined based on one or more vertices of one or more surfaces on the pallet and/or stack of items on the pallet. The one or more vertices may be determined based at least in part on the one or more edges. For example, a vertex may correspond to a corner or point at which two edges meet.

According to various embodiments, in response to determining the possible locations at which the item may be placed (e.g., based on the edges of the pallet, edges of the items on the pallet, and/or edges of the various surfaces on which the item may be placed such as edges formed by the items on the pallet), the system determines a set of feasible locations based at least in part on corresponding expected stability measures. As an example, the system may determine the set of feasible locations at least by removing from the possible locations those locations for which the item after placement (or a stack of items after placement of the item) is expected to be unstable. As another example, the system may determine the set of feasible locations at least by removing, from the possible locations, those locations for which an expected stability of the item after placement (or expected stability of a stack of items after placement of the item) is below a certain stability threshold. The stability threshold may be preconfigured and/or may be set such that only a set of N best locations remains in the set of feasible locations. N may be an integer, or a percentile of a total number of the possible locations. The system may call or execute a physics engine to evaluate an expected stability associated with placing an item at a particular location, and based at least in part on a response from the physics engine (e.g., as to whether the stack of items is expected to be stable, or unstable or not sufficiently stable), the system may determine whether the particular possible location is a feasible location (e.g., whether the particular possible location is to be included in the set of feasible locations).

According to some embodiments, the system determines a destination location at which to place the item based on the value of the scoring function associated with the destination location. In response to determining the set of feasible locations at which the item may be placed, the system may determine corresponding values of the scoring function associated with the locations comprised in the set of feasible locations. The scoring function may include weighted values associated with one or more of packing density, pallet/stack stability, time to complete palletization, time to complete placement of a set of items, etc. Values for other characteristics associated with the pallet/palletization process may be included in the function pertaining to the best placement. In some embodiments, the scoring function may include, or be used with, a cost function associated with moving the item to a particular location. The location in the set of feasible locations with the best score (e.g., a highest score) based on the scoring function may be selected as the destination location at which the item is to be placed.

According to various embodiments, the scoring function may be indicative of a goodness of a pallet/stack of items. For example, the scoring function may correspond to an objective measure pertaining to one or more characteristics of the pallet/stack of items. The scoring function may include weighted values associated with one or more of packing density, pallet/stack stability, time to complete palletization, time to complete placement of a set of items, etc. Values for other characteristics associated with the pallet/palletization process may be included in the function pertaining to the best placement. In some embodiments, the scoring function is determined based on a parameterizing a function comprising at least values or variables corresponding to a current pallet, a current item, and a placement location. According to various embodiments, the parameters of the scoring function are trained based on one or more machine learning methods. In connection with determining a value of for the scoring function, the system may call or execute a physics engine in connection with determining a stability (or expected stability) of the pallet/stack of items.

In some embodiments, the determining of a location at which to place the item is based at least in part on a relatively small number of next items to be placed (e.g., a small number of a next sequence of items to be placed). For example, the determining the location at which the current item may be based at least in part on the current item, a next item, and one or more edges corresponding to surfaces on which the current item and/or the next item may be placed. In some embodiments, the scoring function is determined based on a parameterizing a function comprising at least values or variables corresponding to a current pallet, a next item, and a placement location. According to various embodiments, the parameters of the scoring function are trained based on one or more machine learning methods.

According to various embodiments, the one or more machine learning methods used in connection with training the scoring function (e.g., training parameters in the scoring function), a state estimator (e.g., a set of state estimation models) and/or a placement model(s) (e.g., to determine placements of items), and/or physics engine may include one or more of: a supervised learning, an unsupervised learning, a classification learning implementation, a regression learning implementation, a clustering implementation, etc. Examples of a classification learning implementation may include one or more of a support vector machines model, a discriminant analysis model, a naïve Bayes model, nearest neighbor model, etc. Examples of a regression learning implementation may include one or more of a linear regression GLM model, a support vector regression model, a Gaussian process regression model, an ensemble methods model, a decision tree model, a neural network model, etc. Examples of a clustering implementation include one or more of a K-means model, a K-Medoids model, a Fuzzy C-Means model, a hierarchical model, a Gaussian mixture model, a neural networks clustering model, a hidden Markov model, etc.

FIG. 1 is a diagram illustrating a robotic system to palletize and/or depalletize heterogeneous items according to various embodiments. In some embodiments, system 100 of FIG. 1 implements at least part of process 200 of FIG. 2, process 300 of FIG. 3, process 400 of FIG. 4, process 500 of FIG. 5, process 600 of FIG. 6, process 700 of FIG. 7, and/or process 900 of FIG. 9.

In the example shown, system 100 includes a robotic arm 102. In this example the robotic arm 102 is stationary, but in various alternative embodiments, robotic arm 102 may be a fully or partly mobile, e.g., mounted on a rail, fully mobile on a motorized chassis, etc. As shown, robotic arm 102 is used to pick arbitrary and/or dissimilar items (e.g., boxes, packages, etc.) from a conveyor (or other source) 104 and stack them on a pallet (e.g., platform or other receptacle) 106. The pallet (e.g., platform or other receptacle) 106 may comprise a pallet, a receptacle, or base with wheels at the four corners and at least partially closed on three of four sides, sometimes referred to as a three-sided "roll pallet", "roll cage", and/or "roll" or "cage" "trolley". In other embodiments, a roll or non-wheeled pallet with more, fewer, and/or no sides may be used. In some embodiments, other robots not shown in FIG. 1 may be used to push receptacle 106 into position to be loaded/unloaded and/or into a truck or other destination to be transported, etc.

In some embodiments, a plurality of receptacles 106 may be disposed around robotic arm 102 (e.g., within a threshold proximity or otherwise within range of the robotic arm). The robotic arm 102 may simultaneously (e.g., concurrently and/or contemporaneously) stack one or more items on the plurality of pallets. Each of the plurality of pallets may be associated with a manifest and/or order. For example, each of the pallets may be associated with a preset destination (e.g., customer, address, etc.). In some instances, a subset of the plurality of pallets may be associated with a same manifest and/or order. However, each of the plurality of pallets may be associated with different manifests and/or orders. Robotic arm 102 may place a plurality of items respectively corresponding to a same order on a plurality of pallets. System 100 may determine an arrangement (e.g., a stacking of items) on the plurality of pallets (e.g., how the plurality of items for an order are to be divided among the plurality of pallets, how the items on any one pallet are to be stacked, etc.). System 100 may store one or more items (e.g., item(s) for an order) in a buffer or staging area while one or more other items are stacked on a pallet. As an example, the one or more items may be stored in the buffer or staging area until such time that system 100 determines that the respective placement of the one or more items on the pallet (e.g., on the stack) satisfies (e.g., exceeds) a threshold fit or threshold stability. The threshold fit or threshold stability may be a predefined value or a value that is empirically determined based at least in part on historical information. A machine learning algorithm may be implemented in connection with determining whether placement of an item on a stack would is expected to satisfy (e.g., exceeds) a threshold fit or threshold stability, and/or in connection with determining the threshold fit or threshold stability (e.g., the thresholds against which a simulation or model are measured to assess whether to place the item on the stack).

In the example shown, robotic arm 102 is equipped with a suction-type end effector (e.g., end effector 108). End effector 108 has a plurality of suction cups 110. Robotic arm 102 is used to position the suction cups 110 of end effector 108 over an item to be picked up, as shown, and a vacuum source provides suction to grasp the item, lift the item from conveyor 104, and place the item at a destination location on receptacle 106. Various types of end effectors may be implemented.

In various embodiments, system 100 comprises a vision system that is used to generate a model of the workspace (e.g., a 3D model of the workspace and/or a geometric model). For example, one or more of 3D or other camera(s) 112 mounted on end effector 108 and cameras 114, 116 mounted in a space in which system 100 is deployed are used to generate image data used to identify items on conveyor 104 and/or determine a plan to grasp, pick/place, and stack the items on receptacle 106 (or place the item in the buffer or staging area, as applicable). In various embodiments, additional sensors not shown, e.g., weight or force sensors embodied in and/or adjacent to conveyor 104 and/or robotic arm 102, force sensors in the x-y plane and/or z-direction (vertical direction) of suction cups 110, etc. may be used to identify, determine attributes of, grasp, pick up, move through a determined trajectory, and/or place in a destination location on or in receptacle 106 items on conveyor 104 and/or other sources and/or staging areas in which items may be located and/or relocated, e.g., by system 100.

In the example shown, camera(s) 112 is mounted on the side of the body of end effector 108, but in some embodiments, camera(s) 112 and/or additional cameras may be mounted in other locations, such as on the underside of the body of end effector 108, e.g., pointed downward from a position between suction cups 110, or on segments or other structures of robotic arm 102, or other locations. In various embodiments, cameras such as 112, 114, and 116 may be used to read text, logos, photos, drawings, images, markings, barcodes, QR codes, or other encoded and/or graphical information or content visible on and/or comprising items on conveyor 104.

In some embodiments, system 100 comprises a dispenser device (not shown) that is configured to dispense a quantity of spacer material from a supply of spacer material in response to the control signal. The dispenser device may be disposed on robotic arm 102, or within proximity of the workspace (e.g., within a threshold distance of the workspace). For example, dispenser device may be disposed within the workspace of robotic arm 102 such that dispenser device dispenses spacer material on or around receptacle 106 (e.g., pallet), or within a predetermined distance of end effector 108 of robotic arm 102. In some embodiments, dispenser device comprises a mounting hardware configured to mount dispenser device on or adjacent to an end effector 108 of robotic arm 102. The mounting hardware is at least one of a bracket, a strap, and one or more fasteners, etc. As an example, dispenser device may comprise a biasing device/mechanism that biases supply material within dispenser device to be ejected dispensed from dispenser device. Dispenser device may include a gating structure that is used to control the dispensing of spacer material (e.g., to prevent spacer material to be dispensed without actuation of the gating structure, and to permit dispensing of the spacer material to be dispensed in response to actuation).

Dispenser device may comprise a communication interface configured to receive a control signal. For example, dispenser device may be in communication with one or more terminals such as control computer 118. The dispenser device may communicate with the one or more terminals via one or more wired connections and/or one or more wireless connections. In some embodiments, dispenser device communicates information to the one or more terminals. For example, dispenser device may send to control computer 118 an indication of a status of the dispenser device (e.g., an indication of whether dispenser device is operating normally), an indication of a type of spacer material comprised in dispenser device, an indication of a supply level of the spacer material in dispenser device (e.g., an indication of whether the dispenser device is full, empty, half full, etc.). Control computer 118 may be used in connection with controlling dispenser device to dispense a quantity of spacer material. For example, control computer 118 may determine that a spacer is to be used in connection with palletizing one or more items, such as to improve a stability of expected stability of the stack of items on/in receptacle 106. Control computer 118 may determine the quantity of spacer material (e.g., a number of spacers, an amount of spacer material, etc.) to use in connection with palletizing the one or more items. For example, the quantity of spacer material to use in connection with palletizing the one or more items may be determined based at least in part on determining a plan for palletizing the one or more items.

In some embodiments, dispenser device comprises an actuator configured to dispense a quantity of spacer material from a supply of spacer material in response to the control signal. In response to determining that a spacer/spacer material is to be used in connection with palletizing one or more items, control computer 118 may generate the control signal to cause the actuator to dispense the quantity of spacer material. The control signal may comprise an indication of the quantity of spacer material to be used as the spacer.

According to various embodiments, a spacer or a spacer material is rigid block. For example, spacer or a spacer material may be a rigid block of foam. In some embodiments, a spacer or a spacer material comprises polyurethane.

In some embodiments, the supply of spacer material comprises a plurality of precut blocks. The plurality of precut blocks may be preloaded into a spring-loaded cartridge that biases the plurality of precut blocks to a dispensing end. In response to a precut block being dispensed from the cartridge, another of the plurality of precut blocks is pushed to a next-in-line position to be dispensed from the cartridge.

In some embodiments, the supply of spacer material comprises one or more of a larger block of spacer material, a strip of spacer material, and a roll of spacer material. The dispenser device or system 100 may comprises a cutter that is configured to cut the quantity of spacer material from the supply of the spacer material. In response to the control signal being provided to the actuator, the actuator may cause the cutter to cut the quantity of the spacer material from the supply of the spacer material.

In some embodiments, the supply of the spacer material comprises a liquid precursor. In response to the control signal being provided to the actuator, the actuator causes the quantity of the spacer material to be dispensed onto a surface of a pallet or a stack of items on the pallet. The dispensed precursor may harden after being dispensed onto the surface of the pallet or the stack of items on the pallet.

In some embodiments the supply of spacer material comprises an extruded material. In response to the control signal being provided to the actuator, the extruded material is filled to one or more of a desired size and a desired firmness. The extruded material may be sealed in response to a determination that the extruded material is filled to the one or more of the desired size and the desired firmness. In some embodiments, the extruded material is filled with a fluid. The fluid may be one or more of air, water, etc. In some embodiments, the extruded material is filled with a gel.

In various embodiments, a robotically controlled dispenser tooling or machine fills the void between and/or adjacent to boxes to prepare the surface area for the next box/layer being placed. In some embodiments, system 100 may use a robotic arm 102 to pick/place predefined cut material and/or may dynamically trim the spacer material to fit the need of the surface area of the next item being placed. In some embodiments, the robotically controlled the dispenser device, or robotic palletization system comprising the robotically controlled dispenser, comprises a device to trim to size a rectangular solid from a long tube and/or packaging, and place the rectangular solid on an existing pallet in connection with preparing the surface area for a next box or item which the system determines may not normally fit on the pallet surface area (e.g., on an upper surface of a previous layer). The spacer may include, without limitation, foam, an inflated air plastic packet, wood, metal, plastic, etc. The dispenser device may place (e.g., eject, dispense, etc.) the rectangular solid (e.g., the spacer) on the pallet directly, and/or the device may dispense the rectangular solid (e.g., the spacer) in proximity of the robotic arm, and the end effector may reposition/place the rectangular solid (e.g., the spacer) on the pallet surface area. The dispenser device may dispense a predetermined amount (e.g., a correct amount or an expected amount) of the spacer material to correct or improve the surface area discrepancy between boxes or items on the layer (e.g., on the upper surface of the layer) to prepare the surface area for a next box or item.

Referring further to FIG. 1, in the example shown system 100 includes a control computer 118 configured to communicate, in this example via wireless communication (but in one or both of wired and wireless communication in various embodiments) with elements such as robotic arm 102, conveyor 104, end effector 108, and sensors, such as cameras 112, 114, and 116 and/or weight, force, and/or other sensors not shown in FIG. 1. In various embodiments, control computer 118 is configured to use input from sensors, such as cameras 112, 114, and 116 and/or weight, force, and/or other sensors not shown in FIG. 1, to view, identify, and determine one or more attributes of items to be loaded into and/or unloaded from receptacle 106. In various embodiments, control computer 118 uses item model data in a library stored on and/or accessible to control computer 118 to identify an item and/or its attributes, e.g., based on image and/or other sensor data. Control computer 118 uses a model corresponding to an item to determine and implement a plan to stack the item, along with other items, in/on a destination, such as receptacle 106. In various embodiments, the item attributes and/or model are used to determine a strategy to grasp, move, and place an item in a destination location, e.g., a determined location at which the item is determined to be placed as part of a planning/replanning process to stack items in/on the receptacle 106.

In the example shown, control computer 118 is connected to an "on demand" teleoperation device 122. In some embodiments, if control computer 118 cannot proceed in a fully automated mode, for example, a strategy to grasp, move, and place an item cannot be determined and/or fails in a manner such that control computer 118 does not have a strategy to complete picking and placing the item in a fully automated mode, then control computer 118 prompts a human user 124 to intervene, e.g., by using teleoperation device 122 to operate the robotic arm 102 and/or end effector 108 to grasp, move, and place the item.

A user interface pertaining to operation of system 100 may be provided by control computer 118 and/or teleoperation device 122. The user interface may provide a current status of system 100, including information pertaining to a current state of the pallet (or stack of items associated therewith), a current order or manifest being palletized or de-palletized, a performance of system 100 (e.g., a number of items palletized/de-palletized by time), etc. A user may select one or more elements on the user interface, or otherwise provide an input to the user interface, to activate or pause system 100 and/or a particular robotic arm in system 100.

According to various embodiments, system 100 implements a machine learning process to model a state of a pallet such as to generate a model of a stack on the pallet. The machine learning process may include an adaptive and/or dynamic process for modeling the state of the pallet. The machine learning process may define and/or update/refine a process by which system 100 generates a model of the state of the pallet. The model may be generated based at least in part on input from (e.g., information obtained from) one or more sensors in system 100 such as one or more sensors or sensor arrays within workspace of robotic arm 102. The model may be generated based at least in part on a geometry of the stack, a vision response (e.g., information obtained by one or more sensors in the workspace), and the machine learning processes, etc. System 100 may use the model in connection with determining an efficient (e.g., maximizing/optimizing an efficiency) manner for palletizing/de-palletizing one or more items, and the manner for palletizing/de-palletizing may be bounded by a minimum threshold stability value. The process for palletizing/de-palletizing the one or more items may be configurable by a user administrator. For example, one or more metrics by which the process for palletizing/de-palletizing is maximized may be configurable (e.g., set by the user/administrator).

In the context of palletizing one or more items, system 100 may generate the model of the state of the pallet in connection with determining whether to place an item on the pallet (e.g., on the stack), and selecting a plan for placing the item on the pallet, including a destination location at which the item is to be placed, a trajectory along which the item is to be moved from a source location (e.g., a current destination such as a conveyor) to the destination location. System 100 may also use the model in connection with determining a strategy for releasing the item, or otherwise placing the item on the pallet (e.g., applying a force to the item to snug the item on the stack). The modelling of the state of the pallet may include simulating placement of the item at different destination locations on the pallet (e.g., on the stack) and determining corresponding different expected fits and/or expected stability (e.g., a stability metric) that is expected to result from placement of the item at the different locations. System 100 may select a destination location for which the expected fit and/or expected stability satisfies (e.g., exceeds) a corresponding threshold value. Additionally, or alternatively, system 100 may select a destination location that optimizes the expected fit (e.g., of the item on the stack) and/or expected stability (e.g., of the stack).

Conversely, in the context of de-palletizing one or more items from a pallet (e.g., a stack on the pallet), system 100 (e.g., control computer 118) may generate the model of the state of the pallet in connection with determining whether to remove an item on the pallet (e.g., on the stack), and selecting a plan for removing the item from the pallet. The model of the state of the pallet may be used in connection with determining an order in which items are removed from the pallet. For example, control computer 118 may use the model to determine whether removal of an item is expected to cause stability of the state of the pallet (e.g., the stack) to drop below a threshold stability. System 100 (e.g., control computer 118) may simulate removal of one or more items from the pallet and select an order for removing items from the pallet that optimizes the stability of the state of the pallet (e.g., the stack). System 100 may use the model to determine a next item to remove from the pallet. For example, control computer 118 may select an item as a next item to remove from the pallet based at least in part on a determination that an expected stability of the stack during and/or after removal of the item exceeds a threshold stability. The model and/or the machine learning process may be used in connection with determining strategies for picking an item from the stack. For example, after an item is selected to be the next item to remove from the stack, system 100 may determine the strategy for picking the item. The strategy for picking the item may be based at least in part on the state of the pallet (e.g., a determined stability of the stack), an attribute of the item (e.g., a size, shape, weight or expected weight, center of gravity, type of packaging, etc.), a location of the item (e.g., relative to one or more other items in the stack), an attribute of another item on the stack (e.g., an attribute of an adjacent item, etc.), etc.

According to various embodiments, a machine learning process is implemented in connection with improving grasping strategies (e.g., strategies for grasping an item). System 100 may obtain attribute information pertaining to one or more items to be palletized/de-palletized. The attribute information may comprise one or more of an orientation of the item, a material (e.g., a packaging type), a size, a weight (or expected weight), or a center of gravity, etc. System 100 may also obtain a source location (e.g., information pertaining to the input conveyor from which the item is to be picked), and may obtain information pertaining to a pallet on which the item is to be placed (or set of pallets from which the destination pallet is to be determined such as a set of pallets corresponding to the order for which the item is being stacked). In connection with determining a plan for picking and placing the item, system 100 may use the information pertaining to the item (e.g., the attribute information, destination location, etc.) to determine a strategy for picking the item. The picking strategy may include an indication of a picking location (e.g., a location on the item at which the robotic arm 102 is to engage the item such as via the end effector). The picking strategy may include a force to be applied to pick the item and/or a holding force by which the robotic arm 102 is to grasp the item while moving the item from a source location to the destination location. System 100 may use machine learning processes to improve the picking strategies based at least in part on an association between information pertaining to the item (e.g., the attribute information, destination location, etc.) and performance of picking the item (e.g., historical information associated with past iterations of picking and placing the item or similar items such as items sharing one or more similar attributes).

According to various embodiments, system 100 may determine to use a spacer or a quantity of the spacer material in connection with palletizing one or more items in response to a determination that the use of the spacer or quantity of the spacer material will result in an improved stack of items on the pallet (e.g., improve the stability of the stack of items). In some embodiments, the determination that the placing one or more spacers in connection with placing the set of N items on the pallet will result in an improved stack of items on the pallet is based at least in part on one or more of a packing density, a level top surface, and a stability. In some embodiments, the determination that the placing one or more spacers in connection with placing the set of N items on the pallet will result in an improved stack of items on the pallet is based at least in part on a determination that a packing density of the stack of items with the set of N items is higher than a packing density if the set of N items are placed on the pallet without the one or more spacers. In some embodiments, the determination that the placing one or more spacers in connection with placing the set of N items on the pallet will result in an improved stack of items on the pallet is based at least in part on a determination that a top surface is more level than a top surface if the set of N items are placed on the pallet without the one or more spacers. In some embodiments, the determination that the placing one or more spacers in connection with placing the set of N items on the pallet will result in an improved stack of items on the pallet is based at least in part on a determination that a stability of the stack of items with the set of N items is higher than a stability if the set of N items are placed on the pallet without the one or more spacers. N may be a positive integer (e.g., a positive integer less than a total number of items that are to be palletized in the complete pallet).

As an example, because N may be less than a total number of items that are to be palletized, system 100 may be limited in its optimization of the stack of items (e.g., robotic system may only plan the placement of N items at a time). Accordingly, the use of one or more spacers increases number of degrees of freedom associated with placing the N items. System 100 may use one or more spacers to optimize the stacking of the N items (or to achieve a "good enough" stack with the N items such as a stack that satisfies a minimum stability threshold). System 100 may use a cost function in connection with determining whether to use one or more spacers, a number of spacers to use, a placement of the spacers, etc. For example, the cost function may include one or more of a stability value, a time to place the one or more items, a packing density of the stack of items, a flatness value or degree of variability of the top of the upper surface of the stack of items, and a cost of supply material, etc.

According to various embodiments, control computer 118 controls system 100 to place a spacer on a receptacle 106 (e.g., a pallet) or a stack of items in connection with improving a stability of the stack of items on the receptacle 106. As an example, the spacer may be placed in response to a determination that a stability of the stack of items is estimated (e.g., likely such as a probability that exceeds a predefined likelihood threshold value) to be improved if the spacer is used. As another example, control computer 118 may control robotic system to use the spacer in response to a determination that a stability of the stack of items is less than a threshold stability value, and/or that the stability of the stack of items is estimated to be less than a threshold stability value in connection with the placement of a set of items (e.g., a set of N items, N being an integer).

According to various embodiments, control computer 118 determines the stability of a stack of items based at least in part on a model of a stack of items and/or a simulation of placing a set of one or more items. A computer system (e.g., control computer 118, or a remote server, etc.) may obtain (e.g., determine) a current model of a stack of items, and model (e.g., simulate) the placing of a set of item(s). In connection with modeling the stack of items, an expected stability of the stack of items may be determined. The modelling of the stack of items may include modelling the placement of a spacer in connection with the modelling of the placement of the set of item(s).

In some embodiments, control computer 118 determines the stability of the stack of items (or simulated stack of items) based at least in part on one or more attributes of a top surface of the stack of items (or simulated stack of items) and/or spacers. For example, a measure of an extent to which the top surface is flat may be used in connection with determining the stability of the stack of items. The placing of a box on a flat surface may result in a stable placement and/or stack of items. As another example, a surface area of a flat region on the top surface may be used in connection with determining the stability or expected stability of the placement of an item on the stack of items. The larger a flat region on a top surface of the stack of items is relative to a bottom surface of an item being placed on the stack of items, the greater the likelihood the stability of the stack of items will satisfy (e.g., exceed) a threshold stability value.

According to various embodiments, system 100 generates a model of a pallet or a stack of one or more items on the pallet, and the spacer or spacer material is determined to be placed in connection with the palletization of one or more items based at least in part on the model of the pallet or the stack of one or more items on the pallet. System 100 may generate a model of at least a top surface of a pallet or a stack of one or more items on the pallet, determine a set of N items to be placed next on the pallet (e.g., N being a positive integer), determine that placing one or more spacers in connection with placing the set of N items on the pallet will result in an improved stack of items on the pallet compared to a resulting stack of placing the set of N items without spacers, generate one or more control signals to cause the actuator to dispense the quantity of spacer material corresponding to the one or more spacers, and provide the one or more control signals to the actuator in connection with placing the set of N items on the pallet.

According to various embodiments, variation in items (e.g., types of items) among items to be palletized may complicate the palletization of the items in a stable manner (e.g., a manner according to which the stability of the stack of items satisfies a threshold stability value). In some embodiments, control computer 118 may only be able to forecast a certain number of items that are to be palletized. For example, the system may have a queue/buffer of N items to be palletized, where N is a positive integer. N may be a subset of a total number of items to be stacked on a pallet. For example, N may be relatively small in relation to the total number of items to be stacked on the pallet. Accordingly, system 100 may only be able to optimize the stacking of items using the next N known items. For example, system 100 may determine a plan to stack one or more items according to the current state of the stack of items (e.g., a current model) and one or more attributes associated with the next N items to be stacked. In some embodiments, the use of one or more spacers may provide flexibility in the manner in which the next N items are to be stacked and/or may improve the stability of the stack of items.

Various embodiments include palletization of a relatively large number of mixed boxes or items on a pallet. The various boxes and items to be palletized may have different attributes such as heights, shapes, sizes, rigidity, packaging type, etc. The variations across one or more attributes of the various boxes or items may cause the placement of the items on a pallet in a stable manner to be difficult. In some embodiments, system 100 (e.g., control computer 118) may determine a destination location (e.g., a location at which an item is to be placed) for an item having a greater surface area (e.g., a larger bottom surface) than the boxes or other items beneath the item being placed. In some embodiments, items having different heights (e.g., different box heights) may be placed on relatively higher areas of the pallet (e.g., a height greater than a height threshold value equal to a maximum pallet height multiplied by 0.5, a height greater than a height threshold value equal to a maximum pallet height multiplied by ⅔, a height greater than a height threshold value equal to a maximum pallet height multiplied by 0.75, a height greater than a height threshold value equal to a maximum pallet height multiplied by another predefined value).

According to various embodiments, a machine learning process is implemented in connection with improving spacer material dispensing/usage strategies (e.g., strategies for using spacer material in connection with palletizing one or more items). System 100 may obtain attribute information pertaining to one or more items to be palletized/de-palletized, and attribute information pertaining to one or more spacers to be used in connection with palletizing/de-palletizing the one or more items. The attribute information may comprise one or more of an orientation of the item, a material (e.g., a spacer material type), a size, a weight (or expected weight), a center of gravity, a rigidity, a dimension, etc. System 100 may also obtain a source location (e.g., information pertaining to the input conveyor from which the item is to be picked), and may obtain information pertaining to a pallet on which the item is to be placed (or set of pallets from which the destination pallet is to be determined such as a set of pallets corresponding to the order for which the item is being stacked). In connection with determining a plan for picking and placing the item, system 100 may use the information pertaining to the item (e.g., the attribute information, destination location, etc.) to determine a strategy for palletizing the item (e.g., picking and/or placing the item). The palletizing strategy may include an indication of a picking location (e.g., a location on the item at which the robotic arm 102 is to engage the item such as via the end effector) and a destination location (e.g., a location on the pallet/receptacle 106 or stack of items). The palletizing strategy may include a force to be applied to pick the item and/or a holding force by which the robotic arm 102 is to grasp the item while moving the item from a source location to the destination location, a trajectory along which the robotic arm is to move the item to the destination location, an indication of a quantity, if any, of spacer material that is to be used in connection with placing the item at the destination location, and a plan for placing the spacer material. System 100 may use machine learning processes to improve the palletizing strategies based at least in part on an association between information pertaining to the item (e.g., the attribute information, destination location, etc.) and one or more of (i) performance of picking and/or placing the item (e.g., historical information associated with past iterations of picking and placing the item or similar items such as items sharing one or more similar attributes), (ii) performance of a stability of the stack of items after the item is placed at the destination location such as relative to an expected stability generated using a model of the stack of items (e.g., historical information associated with past iterations of palletizing the item or similar items such as items sharing one or more similar attributes), and (iii) performance of a stability of the stack of items after the item and/or spacer material is placed at the destination location such as relative to an expected stability generated using a model of the stack of items (e.g., historical information associated with past iterations of palletizing the item or similar items and/or spacers such as items/spacers sharing one or more similar attributes). In some embodiments, system 100 may use machine learning processes to improve the use of one or more spacers in connection with palletizing strategies based at least in part on an association between information pertaining to the spacers and/or one or more items that are palletized (e.g., the attribute information, destination location, etc.), and a stability performance of palletizing a set of items using one or more spacers relative to an expected stability of the palletizing of the set of items using the one or more spacers (e.g., the expected stability based on a simulation of the palletizing of the items using a model of the stack of items).

The model generated by system 100 can correspond to, or be based at least in part on, a geometric model. In some embodiments, system 100 generates the geometric model based at least in part on one or more items that have been placed (e.g., items for which system 100 controlled robotic arm 102 to place), one or more attributes respectively associated with at least a subset of the one or more items, one or more objects within the workspace (e.g., predetermined objects such as a pallet, a robotic arm(s), a shelf system, a chute, or other infrastructure comprised in the workspace). The geometric model can be determined based at least in part on running a physics engine on control computer 118 to model a stacking of items (e.g., models a state/stability of a stack of items, etc.). The geometric model can be determined based on an expected interaction of various components of the workspace, such as an item with another item, an object, or a simulated force applied to the stack (e.g., to model the use of a forklift or other device to raise/move a pallet or other receptacle on which a stack of items is located).

According to various embodiments, control computer 118 of system 100 is in communication with server 126 such as via a wired or wireless connection (e.g., network). Server 126 provides a service for simulating placement of a set of items and providing an indication/recommendation of a placement for a next item or a sequence of placements for a set of items. Control computer 118 can query server 126 for an indication of a placement for a particular item or for a set of possible placements for a particular item (e.g., which may then be evaluated locally at the control computer 118 to select a placement). In response to obtaining the placement for an item, control computer 118 determines a plan to control robotic arm 102 to pick and place the item according to the placement. Control computer 118 can query server 126 for an indication of a placement for each item or a set of items (e.g., send a query each time the robotic system is to place an item or request a collective sequence of placements for the set of items), or an evaluation of a stack of items such as a simulated stack of items. In connection with querying server 126 for information pertaining to a placement, control computer 118 may send information pertaining to the one or more items for which placement is to be determined/simulated and the estimated state of the workspace, such as a geometric model of a current stack of items. In connection with querying server 126 for an evaluation or physics simulation of a simulated stack of items, control computer 118 may send information pertaining to a geometric model of the simulated stack, an indication of one or more items included in the simulated stack, one or more attributes for the one or more items, etc. Control computer 118 may also provide server 126 with an indication of a scenario that the physics engine is to implement to simulate and evaluate the simulated stack of items.

According to various embodiments, control computer 118 determines (e.g., locally) placement for one or more items based on a state estimator. Control computer may obtain placements for one or more items based on a placement model. The state estimator may be trained by/obtained from server 126. Server 126 simulates various combinations/permutations of state estimator models and placement models (e.g., the models having varying parametrizations, etc.) to determine the state estimator model and/or placement model (e.g., the models to be deployed by system 100 such as by control computer 118).

In some embodiments, server 126 evaluates a plurality of placement models that are used to determine placements of items in connection with picking and placing (e.g., palletizing/depalletizing) a set of items. Server 126 can provide to control computer 118 a placement model that is to be used to determine placements of a set of items that are to be picked and placed by robotic arm 102 (e.g., under control of control computer 118).

In some embodiments, server 126 evaluates a plurality of placement models to determine a placement model to be used in connection with operating a robotic arm to pick and place items. The placement model can be selected (e.g., determined) for a particular set of items. For example, robotic arm 102 can be controlled to use different placement models for determining placements (e.g., locations, orientations, orders, etc.) for different sets of items (e.g., different lists of items, manifests, orders, etc.). In some embodiments, system 100 is configurable to receive selection of a characteristic of a stack of items or other profile associated with the stack of items is to be preferred or biased towards. As an example, system 100 receives selection of the user setting or other preference for a profile of a stack of items from a user, or automatically based on a particular order such as based on a type of transport via which a stack of items is to be transported, etc. Examples of selections for a preference of a type of placement can include: (i) a placement model that is expected to result in a lowest cost (e.g., time, power, etc.) to palletize/depalletize a set of items, (ii) a placement model that is expected to result in a highest stability (or a stability that exceeds a threshold stability) of the stack of items, (iii) a placement model that is expected to result in a highest density (or density that exceeds a density threshold) of the stack of items, (iv) a placement model that is expected to result in a stack of items having highest score according to a scoring function (or a score that exceeds a threshold score), (v) a placement model that is expected to withstand predefined external forces (e.g., a direction of force, a threshold extent of a force, etc.), etc. Various other characteristics or preferences can be used in connection with selecting an appropriate placement model.

In some embodiments, the plurality of placement models can include, for each placement model, simulating placement of boxes or otherwise modelling the stack of items (e.g., the pallet or other receptacle as a base and the individual items stacked thereon) and characterizing the resulting stack of items. Server 126 can perform a plurality (e.g., several) simulations for each placement model and aggregate the results to characterize the placement model. Characterizing the resulting stack of items (and/or placement model) includes determining one or more characteristics or profiles associated with the stack(s) of items resulting from the simulations. For example, server 126 characterizes the resulting stack of items based on computing, for the stack of items, a score (e.g., value) with respect to a predefined scoring function. In some embodiments, characterizing the resulting stack of items (e.g., simulated stack of items) includes simulating interaction among items or objects based on a physics engine. Other examples of characterizing the stack of item can include determining, for the stack(s) of items, a packing density, a stability, an expected time to complete the corresponding placements, a cost to complete the corresponding placements (e.g., based on a predefined cost function), expected stability of the stack of items in response to application of an external force, etc. Various other characteristics can be determined with respect to the stack of items and used to measure a goodness of the resulting stack of items.

The evaluation of at least a subset of the plurality of placement models can be run in parallel. In response to simulating the placements using the plurality of placement models, server 126 determines a placement model that is to be implemented by system 100 in connection with providing placements of items. Server 126 can provide a mapping of placement models to placement scenarios or preferences to allow for system 100 to select a placement model to implement for stacking a particular stack of items (e.g., based on a user or system preference such as to optimize a particular characteristic of the stack of items, etc.). In some embodiments, the placement model to be implemented is determined based at least in part on performing an interpolation among a plurality of simulations for the plurality of placement models that were evaluated. In some embodiments, at least a subset of the plurality of placement models has different noise profiles (e.g., noise modeled for sensor data obtained by the vision system and/or noise modeled for a difference between a geometric model and actual placement of items by a robotic arm according to a plan generated using the geometric model, etc.).

Evaluating the plurality of placement model can include modelling/simulating one or more predefined external forces. In some embodiments, the modelling/simulating the one or more predefined external forces includes obtaining a force profile for a force(s) to be simulated, and using a physics engine to apply the force to the simulated stack of items and to simulate a resulting stack (e.g., to simulate the interaction between the force and the simulated stack, such as on an item-by-item or object-by-object basis). The external forces can be defined by a user (e.g., via client system) or according to a predefined force profile according to types and magnitudes of forces (e.g., gravity, a force representing a movement of the stack of items such as via a forklift, a force representing a collision of another object with the stack of items, etc.).

In some embodiments, server 126 invokes a physics engine in connection with simulating placement of one or more items. The physic engine can be a service that models an interaction between a plurality of items among the stack of items and real-world physics, including forces such as gravity that acts with respect to the stack of items. The physics engine can be further invoked to simulate external forces such as according to a user input or according to an instruction provided by the simulation of the stack of items. For example, the physics engine simulates an external force that acts on the stack of items as the pallet would be removed from a workspace, such as forces acting on a stack of items as the pallet is picked up by a forklift and/or carried by the forklift as the forklift moves. As another example, the physics engine simulates an external force that acts on the stack of items based on an unintended collision with another object such as another item, robotic arm 102, etc.

According to various embodiments, in response to the robot placing an item on the pallet, a system for estimating a state of the pallet and/or a stack of items on the pallet records information pertaining to the placement of the item (e.g., a location of the item, a size of the item, etc.). For example, the system has a logical knowledge of the state of the system based on where the robot has placed various items on the pallet. The logical knowledge may correspond to geometric data such as information obtained based on the manner by which the robot is controlled. However, the logical knowledge may differ from the real-world state of the pallet and/or a stack of items on the pallet. Similarly, as discussed above, the state of the pallet and/or a stack of items on the pallet as detected by the vision system (e.g., the real-world state modeled based on sensor data) may differ from the real-world state such as based on noise in the sensor data or inaccurate/incomplete sensor data. Various embodiments combine the views of the world using the geometric data (e.g., the logical knowledge) and the sensor data. The use of both the geometric data and the sensor data to model the world fills gaps in the worldview of each data set. For example, sensor data obtained based on the vision system may be used in connection with determining whether an expected state of the pallet or stack of items on the pallet needs to be updated/refined. The state estimation according to various embodiments provides better estimates of the state of the pallet and/or stack of items on the pallet than would be possible using sensors alone or geometric data alone. Further, the estimates of the state of the pallet and/or stack of items on the pallet may be used in connection with a palletizing/depalletizing items to/from a pallet. The use of better estimates of the estimates of the state of the pallet and/or stack of items on the pallet in connection with determining palletizing/depalletizing items to/from a pallet may provide better placements, which may lead to better final pallets (e.g., more tightly/densely packed pallets, more stable pallets, etc.).

In some embodiments, in response to a determination that the expected state of the pallet or stack of items using the geometric data is sufficiently different from the state of the pallet or stack of items using the vision system (e.g., the sensor data), system 100 may provide an indication to a user. For example, system 100 prompts the user to confirm whether the expected state using the geometric data is correct, whether the state using the vision system is correct, or whether neither is correct, and the user is to modify the current state. The user may use a user interface to reconcile the difference between the expected state using the geometric data and the state using the vision system. The determination that the expected state using the geometric data is sufficiently different from the state using the vision system may be based on a determination that a difference between the two states, or models of the state, exceeds a predefined difference threshold.

According to various embodiments, the system for estimating the state of the pallet and/or the stack of items on the pallet is implemented on a different computing system, such as a server(s) (e.g., server 126). The modules or algorithms (e.g., the various state estimation models) for modelling the state using the geometric data, modelling the state using the vision system (e.g., the sensor data), and updating the expected state (e.g., based on a reconciliation of the difference between the states) may be high cost and require relatively large amounts of computation power. Further, processing power at the robot workspace or computer system controlling the robot (e.g., control computer 118) may have constraints on computational power and/or bandwidth to execute the modules. In some embodiments, the system controlling the robot may obtain the sensor data and information pertaining to the item to be placed, and send the sensor data and the information pertaining to the item to be placed to a server via one or more networks. In some embodiments, a plurality of servers (e.g., server 126) may be used in connection with implementing the different modules for estimating the state of the system (e.g., the state of the pallet and/or state of the stack of items on the pallet). For example, a module for modelling the state using the geometric data may be executed by a first server, a module for modelling the state using the vision system may be executed by a second server, and a module for updating the expected state based at least in part on the difference between the states may be executed by a third server. The various servers that may implement the different modules for determining the expected state may communicate with one another.

In some embodiments, a state estimator may store and/or manage a difference between (i) the state modeled based on the geometric data, and (ii) the state modeled based on the vision system. For example, the state estimator stores/manages a current state of the pallet and/or stack of items on the pallet. The state estimator may be a module executed by a computer system such as control computer 118 that controls robotic arm 102 to pick and place a set of items, or by a server with which the robotic system controlling the robot is in communication (e.g., server 126).

According to various embodiments, the state estimator may be used in connection with determining a current state during planning/placement of each item. For example, the robotic system controlling the robot and/or determining a plan for moving the item may query the state estimator in connection with determining a plan to move the item. The state estimator may be queried using (i) information pertaining to the item to be placed, and (ii) current sensor data obtained by the vision system. The current state using the geometric data may be stored by, or accessible by, the state estimator. In some embodiments, information pertaining to the current geometric data may be communicated to the state estimator in connection with the querying of the pallet state estimator for current state. In some embodiments, because of the computational intensity of determining the current state using both the geometric data and the vision system (e.g., sensor data), the state estimator may be queried for the current state after a placement of a predetermined number of items (e.g., N items, N being an integer). For example, the state estimator may be queried at a regular frequency. As another example, the state estimator may be queried in response to a determination that was placed (e.g., a previously placed item) had an irregular shape or a certain type of packaging (e.g., a packaging type with little rigidity, such as a poly bag). The state estimator may be implemented by control computer 118 or server 126.

In some embodiments, the state estimator iteratively updates its internal model of the state (e.g., the world, the pallet, and/or the stack of items on the pallet, etc.) after placement of an item, or a simulated placement of an item in the case that the state estimator is invoked to perform simulations with respect to placements of a set of items. The internal model of the state estimator may correspond to a current state of the pallet and/or stack of items on the pallet. The state estimator may update its internal model after placement of each item. For example, the robotic system controlling the robot may provide the information pertaining to the item (e.g., characteristic(s) of the items such as dimensions, weight, center of gravity, etc.), sensor data obtained by the vision system, and/or geometric data corresponding to the location at which the robot was controlled to place the item. In response to receiving the information pertaining to the item, sensor data, and/or geometric data, the state estimator may update its internal model. For example, the state estimator may (i) provide the sensor data to a module for modelling the state using sensor data, (ii) provide, to the module for modelling the state using geometric data, the geometric data and/or information pertaining to the item, and (iii) update its internal model based on a model of the state based on the sensor data and/or a model of the state based on the geometric data (e.g., or a difference between the two states).

The model of the state of the pallet and/or stack of items may be determined using the pallet as a reference (e.g., a bottom of the pallet may be used as a reference point as the bottom of the stack, etc.). The system can use a worst-case placement or orientation of the pallet as a ground truth/basis for estimating the state of the stack of items placed on the pallet (or other receptacle, etc.). The model may be updated after an item is placed such that the item is represented at the location at which the item is placed. The model of the state may be stored as a two-dimensional grid (e.g., 10×10). The model may further comprise information associated with each item in the stack of items on the pallet. For example, one or more characteristics associated with the item may be stored in association with the item in the model. In some embodiments, a stability of the stack of items is determined/computed based on the location of the various items on the stack, and the one or more characteristics associated with the items. The model of the state of the pallet may be translated to a representation in the physical world based on a predetermined translation between units of the stored model and the physical world.

System 100 (e.g., control computer or server 126) may receive, via a communication interface, data associated with a plurality of items to be stacked on or in a destination location; generate based at least in part on the received data a plan to stack the items on or in the destination location; and implement the plan at least in part by controlling robotic arm 102 to pick up to the items and stack the items on or in the destination location according to the plan. To generate the plan to stack the items on or in the destination location may comprise, for each item: determining the destination location based at least in part on a characteristic associated with the item, and at least one of (i) a characteristic of a platform or receptacle on which one or more items are to be stacked, and (ii) a current state of a stack of items on the platform or receptacle, wherein: the current state of a stack of items on the platform or receptacle is based at least in part on geometric data pertaining to placement of one or more items comprised in the stack of items, and sensor data pertaining to the stack of items obtained by a vision system. In some embodiments, the destination location is determined based on invoking a placement model that indicates a placement for a particular item (e.g., based on performing a plurality of simulated placements, etc.). The current state of the stack of items may be determined based at least in part on a difference between the geometric data pertaining to placement of one or more items comprised in the stack of items and the sensor data pertaining to the stack of items obtained by a vision system. The current state of the stack of items on the platform or receptacle may be obtained based at least in part on the robotic system querying a state estimator running on server 126.

During operation of robotic arm 102 to pick and place items, noise may be introduced into system via the sensor data, such as the data obtained by the vision system of the workspace for the robot performing the palletization/depalletization. Examples of sources of noise in the sensor data include: (i) light reflecting off an item or object in the workspace, (ii) dust in the workspace, on an item on the pallet/stack, and/or on the item to be placed, (iii) poor quality reflective surfaces such as mirrors, (iv) reflective surfaces within the workspace such as a robot, a frame, a shelf, another item, an item on the pallet, etc., (v) heat or otherwise a temperature change in the environment, (vi) humidity in the environment, (vii) vibrations in the sensors, (viii) a sensor being knocked or moved during capture of the sensor data, etc., (ix) imperfections in a camera or sensor. Accordingly, the information used in connection with iteratively running physical simulations (e.g., using a placement model(s) to simulate placements of a set of items to determine a set of placements for one or more of the set of items) or developing or evaluating state estimation module/model comprises various noise.

Various embodiments include adding a noisy point cloud to features of the system or workspace for the robot performing the palletization/depalletization. In some embodiments, the computer simulation of a palletization/depalletization of a simulated set of items (e.g., a simulation of placements) may be implemented using the geometric data of the system/workspace and/or items, and one or more other attribute associated with the item. If noise was not introduced to the computer simulation of the palletization/depalletization, then the system would have a representation of an ideal state (e.g., the information pertaining to the state of the pallet would have a built in assumption that each item was perfectly placed according to the determined plan for moving the item, and/or that a state of other items on the stack would not change over time such as via placement of additional items on top thereof, or other environmental factors). Accordingly, computer simulation of the palletization/depalletization of a simulated set of items, and various the state estimation modules/models may not be accurate representations of performance in the physical world. The introduction of noise to the system/information may allow for working conditions of an estimator and/or system to palletize/depalletize a set of items to be artificially recreated without the need of real physical boxes, or a real physical robot. In some embodiments, the noise is introduced by constructing a geometric pallet and/or stack of items and applying a same kind of noise to this perfect/ideal pallet and/or stack of items that would be produced by the imperfections of the camera. The noise may be introduced to other features of the workspace (e.g., sensor data pertaining to other objects or items in the system, such as an item buffer, items on a conveyor, etc.).

Implementing a computer simulation of a palletization/depalletization of a simulated set of items is more efficient than iteratively using a real-world physical robot to physically move a set of real-world physical items. The increased speed of the computer simulation allows the system to use and evaluate/assess a wider variety (or larger number) of state estimation modules/models or placement models.

According to various embodiments, system 100 simulates at least part of a palletization/depalletization process, wherein a noise is input to at least information pertaining to a pallet and/or stack of items on the pallet. System 100 (e.g., control computer 118 or server 126) may iteratively implement the simulation using a plurality of different state estimation modules/models and/or different configurations for the simulation. The different state estimation modules/models may comprise different algorithms for determining a state of the pallet and/or stack of items on the pallet, etc. The different configurations for the simulation may comprise different input sequence of items, different sets of items to be palletized/depalletized, different destination locations for an item, etc. System 100 may compare the results of the various computer simulations in connection with improving a state estimation module/model and/or selecting a state estimation module/model.

Using the results of the various computer simulations to improve a state estimation module/model may include implementing a machine learning process. Various computer simulations of the palletization/depalletization process using different configurations for the various simulations may iteratively run, and the state estimation module/model may be iteratively updated based on the results of the various simulations.

According to various embodiments, the results of various computer simulations of a set of different state estimation modules/models may be quantitatively evaluated and/or compared. The system may determine a best state estimation module/model based on the comparison. A best state estimation module/model may be determined according to one or more factors, including time to complete palletization/depalletization, packing density of a pallet, stability of the pallet and/or stack of items, accuracy of estimating the state of a pallet and/or stack of items, etc.

According to various embodiments, system 100 (e.g., control computer 118 if performed locally, or server 126 if provided as a cloud service, etc.) determines placement of the items according to the selected, or determined, placement model. In some embodiments, the determination of placements of items (e.g., destination locations and orientations) is performed on an item-by-item basis. For example, system 100 may determine a location at which to place a current item based at least in part on one or more results of a scoring function corresponding to the potential placement of the current item at one or more potential locations/orientations. System 100 determines, for each of a plurality of candidate placements for a next item to be placed, a corresponding score with respect to the scoring function, determine a current state value associated with a current state of the pallet (e.g., the estimated state), and selects a selected placement based at least in part on the respective scores for the plurality of candidate placements. In some embodiments, system 100 does not use a simulation of performing placement of a subsequent item (e.g., to obtain a result of a scoring function for placing the subsequent item) in connection with determining a result of the one or more results of a scoring function corresponding to the potential placement of the current item at one or more potential locations. In other words, in some embodiments, system 100 may use limited knowledge of future or subsequent items in determining the placement of the current item. In some embodiments, system 100 models (e.g., simulates) estimated states for placement of a predefined number of placements (e.g., X placements, where X is a positive integer).

In connection with determining placements (e.g., plans corresponding to the placements) for a set of items and controlling robotic arm 102 to pick and place the set of items in accordance with the placements, system 100 determines a state space, an action space, and a search space. System 100 determines the search space based at least in part on determining various placement locations and/or orientations for the set of items (e.g., a current item and a preset number of next items). System 100 can further determine the search space based on a change in an order of placement of items in the set of items if system 100 is configured to permit a buffering of one or more items. System 100 bounds the search space for possible placements of a current item (e.g., a first next item) based on determining a set of placements that satisfy a criteria for possible placements. As an example, the criteria for possible placements can be a predefined scoring threshold according to a predefined scoring function. As another example, the criteria for possible placements can be a predefined cost threshold according to a predefined cost function.

In some embodiments, system 100 determines that an item is to be placed on a pallet. In response to determining that the item is to be placed, system 100 may obtain/determine a current state of the pallet/stack of items, and determine a placement (e.g., a destination location and/or orientation) according to which the item is to be placed. The determining of the placement according to which the item is to be placed may comprise determining the possible combinations of destination locations and orientations for which the item may be placed, and determining a corresponding value of a scoring function (or a cost function) associated with the pallet/stack of items if the item were to be placed at least at a subset of the possible locations. In response to determining the corresponding value of the scoring function, system 100 determines the placement according to which the item is to be placed based on the value of the scoring function associated with the placement. For example, system 100 selects the placement that yields a best result (e.g., a best placement according to the scoring function or the cost function). The placement yielding the best result may be determined based at least in part on simulating placement and stack of items using a physics engine and evaluating a resulting simulated stack of items. In response to determining the placement for the item, system 100 may determine a plan to move the item and place the item according to the placement (e.g., at the destination location and in the corresponding orientation, etc.). In response to determining the plan, system 100 controls robotic arm 102 to implement the plan to move the item and place the item at the destination location. According to various embodiments, system 100 iteratively performs the determining the placement for an item for at least a plurality of a set of items to be picked and placed on the pallet (e.g., the set of items to be palletized). System 100 may also iteratively determine a plan to pick and place (e.g., palletize) an item and to control the robot to implement the plan to pick and place the item for at least a plurality of the set of items.

In some embodiments, the possible locations at which the item may be placed are determined based at least in part edges of the pallet/stack of items. For example, on the top surface of the pallet (e.g., before any items are placed on the pallet), the edges may correspond to the circumference of the pallet (e.g., circumference of a top surface of the pallet). As another example, on the top surface of the pallet (e.g., before any items are placed on the pallet), the edges may be determined based on the corners of the pallet. If one or more items have been placed on the pallet, a top surface of the stack may be uneven (e.g., non-planar). The possible locations at which the item may be placed may be determined based at least in part on the edges of one or more of (i) edges of the pallet, and (ii) one or more edges of one or more items on the pallet/stack of items. In some embodiments, the possible locations at which the item may be placed may be determined based at least in part on the edges of one or more of (i) edges of the pallet, and (ii) corners of at least two edges of one or more items on the pallet/stack of items. In some embodiments, if one or more items have already been placed on the pallet, then the possible locations on which the item may be placed may comprise one or more of (i) pallet, and (ii) one or more surfaces of layers formed by an item(s) placed on the pallet. The determining locations at which the item may be placed is based at least in part determining one or more edges corresponding to (e.g., defining) surfaces on which an item may be placed. For example, one or more edges may be determined for various layers or surfaces formed by items already placed on the pallet (e.g., a top surface of one or more of the items already placed on the pallet).

According to various embodiments, in response to determining the possible locations and orientations according to which the item may be placed (e.g., based on the edges of the pallet, edges of the items on the pallet, and/or edges of the various surfaces on which the item may be placed such as edges formed by the items on the pallet), system 100 determines a set of feasible placements (e.g., locations, orientations, etc.) based at least in part on corresponding expected stability measures. As an example, system 100 determines the set of feasible locations at least by removing from the possible locations those locations for which the item after placement (or a stack of items after placement of the item) is expected to be unstable. As another example, system 100 determines the set of feasible locations at least by removing from the possible locations those locations for which an expected stability of the item after placement (or expected stability of a stack of items after placement of the item) is below a certain stability threshold. The stability threshold may be preconfigured and/or may be set such that only a set of N best locations remains in the set of feasible locations. N may be an integer, or a percentile of a total number of the possible locations.

According to some embodiments, system 100 uses a placement model to determine a destination location at which to place the item based on the value of the scoring function associated with the destination location. In response to determining the set of feasible locations at which the item may be placed, system 100 may determine corresponding values of the scoring function associated with the locations comprised in the set of feasible locations. The scoring function may include weighted values associated with one or more of packing density, pallet/stack stability, time to complete palletization, time to complete placement of a set of items, etc. Values for other characteristics associated with the pallet/palletization process may be included in the function pertaining to the best placement. In some embodiments, the scoring function may include, or be used with, a cost function associated with moving the item to a particular location. The location in the set of feasible locations with the best score (e.g., a highest score) based on the scoring function may be selected as the destination location at which the item is to be placed.

According to various embodiments, the scoring function is indicative of a goodness of a pallet/stack of items. For example, the scoring function corresponds to an objective measure pertaining to one or more characteristics of the pallet/stack of items. The scoring function may include weighted values associated with one or more of packing density, pallet/stack stability, time to complete palletization, time to complete placement of a set of items, expected collisions, expected positioning of robotic arm 102 in an awkward position/pose, etc. Values for other characteristics associated with the pallet/palletization process may be included in the function pertaining to the best placement. In some embodiments, the scoring function is determined based on a parameterizing a function comprising at least values or variables corresponding to a current pallet, a current item, and a placement location. The parameters of the scoring function may be trained based on one or more machine learning methods.

In some embodiments, the determining a placement (e.g., a location/orientation) according to which an item (e.g., a current item/first next item) is to be placed is based at least in part on a relatively small number (e.g., a predefined number) of next items to be placed (e.g., a small number of a next sequence of items to be placed). For example, the placement according to which the item is to be placed is determined based at least in part on the current item (e.g., one or more attributes of the current item), a next item(s) (e.g., one or more attributes of such item(s)), and one or more edges corresponding to surfaces on which the current item and/or the next item(s) may be placed. In some embodiments, the scoring function is determined based on a parameterizing a function comprising at least values or variables corresponding to a current pallet, a next item, and a placement location. The parameters of the scoring function may be trained based on one or more machine learning methods.

According to various embodiments, the one or more machine learning methods used in connection with training the scoring function (e.g., training parameters in the scoring function) may include one or more of: a supervised learning, an unsupervised learning, a classification learning implementation, a regression learning implementation, a clustering implementation, etc. Examples of a classification learning implementation may include one or more of a support vector machines model, a discriminant analysis model, a naïve Bayes model, nearest neighbor model, etc. Examples of a regression learning implementation may include one or more of a linear regression GLM model, a support vector regression model, a Gaussian process regression model, an ensemble methods model, a decision tree model, a neural network model, etc. Examples of a clustering implementation include one or more of a K-means model, a K-Medoids model, a Fuzzy C-Means model, a hierarchical model, a Gaussian mixture model, a neural networks clustering model, a hidden Markov model, etc.

According to various embodiments, the system determines an estimated state of the stack of items. For example, system 100 determines the estimated state in response to placement of a next item, or in response to placement of N next items, etc. The estimated state can be determined based at least in part on one or more of a geometric model of the stack of items (or of the workspace) and/or sensor data (e.g., data obtained by the vision system of system 100).

In some embodiments, system 100 uses sensor data and geometric data (e.g., a geometric model) in connection with determining a location to place one or more items on a pallet (or in connection with depalletizing one or more items from a pallet). System 100 may use different data sources to model the state of a pallet (or a stack of items on a pallet). For example, system 100 estimates locations of one or more items on the pallet and one or more characteristics (or attributes) associated with the one or more items (e.g., a size of the item(s)). The one or more characteristics (or attributes) associated with the one or more items may include an item size (e.g., dimensions of the item), a center of gravity, a rigidity of the item, a type of packaging, a deformability, a shape, a location of an identifier, etc.

According to various embodiments, system 100 uses a state estimator to estimate a state of a workspace. For example, system 100 determines an estimated state based on a state estimation model and a geometric model and/or sensor data obtained from a vision system in the workspace. System 100 can estimate a state (also referred to herein as an estimated state) of a workspace based at least in part on geometric data (e.g., a geometric model of the workspace) and sensor data (e.g., data obtained by one or more sensors deployed in a workspace). In response to obtaining the estimated state of the workspace, system 100 uses the estimated state in connection with moving an item in the workspace. For example, system 100 uses the estimated state to determine a plan and/or strategy for picking an item from a source location and placing the item at a target location (also referred to herein as a destination location). System 100 (e.g., control computer 118) can use the estimated state and an indication of one or more items to query a server 126 for a placement of the one or more items. As another example, system 100 uses the estimated state to determine a placement of a next item.

According to various embodiments, the geometric model is determined based at least in part on one or more attributes for one or more items in the workspace. For example, the geometric model reflects respective attributes of a set of items (e.g., one or more of a first set that are palletized/stacked, and a second set of items that is to be palletized/stacked, etc.). Examples of attributes of an item include an item size (e.g., dimensions of the item), a center of gravity, a rigidity of the item, a type of packaging, a location of an identifier, a deformability of the item, a shape of the item, etc. Various other attributes of an item or object within the workspace may be implemented. As another example, the geometric model comprises an expected stability of one or more items stacked on or in the receptacle (e.g., a pallet). The geometric model may include an expected stability of a set of items (e.g., the stack of items) and/or an expected stability of individual items comprised in the stack of items. In some embodiments, system 100 determines an expected stability of an item based at least in part on (i) one or more attributes of the item; and (ii) one or more expected interactions with respect to the item and another item or object (e.g., a pallet) in the workspace. For example, system 100 may determine the expected stability based on a determination of an attribute of another item or object contact the item for which the expected stability is being computed. Examples of attributes of other items that may impact the expected stability of a particular item include rigidity, deformability, a size. As an example, if a particular item is rests on another item that is rigid, the particular item is likely to have an improved expected stability as compared to a case whether the particular item rests on another item that is not rigid or less rigid. As another example, if a particular item is rests on another item that is deformable, such as comprised a soft packaging, the particular item is likely to have a lesser expected stability as compared to a case whether the particular item rests on another item that is not deformable or less deformable. As another example, if a particular item rests on another item having a top surface area is greater than a bottom surface areas of the particular item, or if a relatively high percentage of a bottom surface of the particular item is supported by a top surface of another item, then the expected stability of the item is relatively high or at least higher than if the other item has a top surface area smaller than a bottom surface area of the particular item, or if a relatively high percentage of the bottom surface of the particular item is not supported/interacting with a top surface of another item.

In some embodiments, system 100 updates the geometric model after movement (e.g., placement) of each item. For example, system 100 maintains (e.g., stores the geometric model) the geometric model corresponding to a state of the workspace such as a state/stability of a stack of items and location of one or more items among the stack of items. The geometric model uses a current geometric model in connection with determining a plan to move an item, and controlling a robotic arm to move an item. In response to movement of the item, system 100 updates the geometric model to reflect the movement of the item. For example, in the case of de-palletizing a stack of items, in response to a particular item being picked and moved from the stack of items, system 100 updates the geometric model such that the particular item is no longer represented as being on the stack and is comprised in the geometric model at a destination location at which the particular item was placed, or in the event that the destination location is outside the workspace, the geometric model is updated to remove the item. Further, the geometric model is updated to reflect a stability of the stack of items after the particular item has been removed from the stack. As another example, in the case of palletizing a set of items, system 100 updates the geometric model to reflect placement of a particular item on/among a stack of items. System 100 can update the geometric model to include an updated stability of the stack of items based at least in part on the placement of the item on/among the stack of items (e.g., to reflect the interaction that the particular item has with other items or interaction among other items based on placement of the particular item, etc.).

In some embodiments, system 100 updates the current state (e.g., updates based on an update to the geometric model) after (i) movement (e.g., placement) of a predetermined number of items, or (ii) the earlier of movement of the predetermined number of items or detection of an anomaly such as an anomaly that satisfies one or more anomaly criteria (e.g., the extent of the anomaly exceeds an anomaly threshold, etc.). The predetermined number of items (e.g., X items, X being a positive integer) can be set based on user preferences, a robot control system policy, or otherwise determined based on empirical analysis of placement of items. As an example, the predetermined number of items is set based on a determination that the number of items results in an optimal/best result with respect to a predetermined cost function (e.g., a cost function reflecting an efficiency, a stability, expected change in stability, etc.). As an example, system 100 determines a current estimated state and uses the current estimated state to determine a plan for moving the next X items, and after moving the X items (e.g., the stacking or de-stacking of the items) system 100 determines an updated estimated state (e.g., a geometric update/model to reflect placement of the X items). System 100 determines the updated state based at least in part on a combination of the geometric model and the sensor data (e.g., a current geometric model and current sensor data, etc.). System 100 then uses the updated state in connection with determining a plan and controlling a robotic arm to place a next set of items in accordance with the plan.

Determining a plan for picking and placing a set of items (e.g., palletizing the set of items) includes determining a placement location (e.g., a destination location at which the item is to be placed) and an orientation according to which the item is to be placed. In some embodiments, the determining, or updating, the plan for picking and placing a set of one or more items includes assessing various placement locations and orientations for items in the set of items. System 100 determines a search space based on (i) a state space for a state of the pallet or other location at which the set of items are to be placed (e.g., an estimated state that is determined using the state estimator, etc.), and (ii) an action space corresponding to the placement of the respective items in the set of items at the corresponding destination locations and orientations. For example, system 100 determines a set of plans for palletizing the set of items by determining corresponding placements (e.g., placement locations and orientations, etc.) for each item comprised in the set of items. As another example, system 100 determines a plurality of combinations/permutations of placements (e.g., placement locations and orientations, etc.) for each item in the set of items (or N items of the set of items, N being an integer). The determining the plan can further comprise determining one or more characteristics (e.g., expected stability, score for a scoring function, cost for a costing function, etc.) of the stack of items comprising at least part of the set of items placed in the corresponding destination locations and orientations. In some embodiments, system 100 performs a plurality of simulations respectively corresponding to the various combinations/permutations for placing/orienting the set of items. The system can use one or more placement models to perform the plurality of simulations at least with respect to a subset of the set of items. In some embodiments, system 100 uses a model (e.g., queries a model) to assess the various combinations/permutations for placing/orienting the set of items. System 100 can query the model to assess each placement, and can use a result provided by the analysis using the model to determine a placement according to which the item is to be placed (e.g., to select the best placement). The plan is determined based at least in part on a best (e.g., optimal such as having a highest score for a scoring function, or a lowest cost for a cost function, etc.) combination/permutation of destination locations and orientations. The best combination/permutation of destination locations and orientations may be selected based on a cost function such that a cost of the best combination/permutation is the lowest cost combination/permutation or less than a cost threshold (e.g., an absolute threshold, a percentile of costs among the various costs for the different combinations/permutations, etc.). The best combination/permutation of destination locations and orientations may be selected based on a scoring function such that a score of the best combination/permutation is greater than a scoring threshold (e.g., an absolute threshold, a percentile of costs among the various costs for the different combinations/permutations, etc.).

In some embodiments, system 100 determines a search space for placement of a set of N next items, where N is a positive integer. As an example, if items are delivered to a workspace for a robot to pick and place at destination locations, system 100 may be able to determine the next M items to be placed, where M is a positive integer. M is greater than or equal to N (e.g., the next N items may be a subset of the next M items). System 100 may determine the next M items based on sensor data obtained by one or more sensors (e.g., the vision system) in the workspace. In some embodiments, system 100 determines the next N items based on a manifest or other predefined list of items that are to be picked and placed (e.g., palletized).

In some embodiments, system 100 represents the search space as a tree according to which each node corresponds to a different combination of placements for the set of items. System 100 determines the search space based at least in part on a state space and an action space. The state space corresponds to a current state of the workspace (e.g., a current state of the pallet). The action space corresponds to a space defined by the placement(s) of a set of items (e.g., placement locations and orientations, etc.). The root node is a current state of the workspace (e.g., a current state of the pallet). The first step after the root node corresponds to branches/nodes for the various permutations of placement locations and orientations for placement of the first next item. The second step after the root node corresponds to branches/nodes for the various permutations of placement locations and orientations of the second next item.

In some embodiments, system 100 represents the search space as a Markov decision process according to which each node corresponds to a different combination of placements for the set of items. For example, if system 100 does not have knowledge of the full set of items that are to be picked and placed, system 100 implements a Markov decision process because there is uncertainty with respect to future items to be picked and placed.

The placement of the set of items (e.g., destination locations and orientations) is selected by performing a search within the search space. For example, system 100 performs a search within the search space to identify the best/lowest cost solution or a good-enough solution such as a solution that satisfies a predefined cost threshold. As another example, system 100 performs a search within the search space to identify the placement having a highest corresponding score for a scoring function, such as based on using a physics engine to simulate the stack of items using a physics engine. However, traversing the entire search space including all possible combinations of placement locations and orientations can be extremely computationally expensive and can add significant latency into the determination of a plan for placing an item(s). For example, in the case that the search space is represented as a tree, the traversing the various branches of the tree can be inefficient. The search space can grow exponentially as the number of items increases and the pallet size increases, etc. In some embodiments, system 100 bounds the search space within which system 100 selects a placement(s) (e.g., placement location, orientation, etc.). However, bounding the search space too much can lead to a suboptimal number of combinations/permutations of placements for a set of items from which a placement of a next item is to be determined.

According to various embodiments, system 100 bounds the search space to obtain a more computationally reasonable search space (e.g., to find a more computationally reasonable way to determine an optimal position for an item to be placed). In the case of the search space represented as a tree, system 100 determines a manner by which to prune the tree, and system 100 prunes the tree. As an example, the pruning the tree includes bounding the search space of the tree such that system 100 excludes from consideration as possible placement locations/orientations those states corresponding to pruned branches/nodes. In some embodiments, system 100 restricts analysis of potential placements (locations and orientations), or searches for a best placement (e.g., best combination/permutation of destination locations and orientation, best destination location and orientation for placement of the next item to result in a stable placement of the next set of items, etc.) to those placements in the search space that have not been pruned.

In some embodiments, system 100 prunes the search space (e.g., the tree) based at least in part on querying a model with respect to the various parts of the search space (e.g., query the model for a score with respect to a scoring function, or a cost with respect to a cost function). As an example, each node in the tree corresponds to placement of an item at a particular placement location and an orientation. In some embodiments, system 100 uses the model to assess the placement (e.g., queries the model) in accordance with the placement location and orientation of item(s) corresponding to a particular node in the tree. In response to using the model to assess the placement for a particular node, system 100 determines whether to prune the tree at such node. System 100 can determine to prune the tree at such node based at least in part on a score for a scoring function, a cost for a cost function, or another attribute pertaining to an expected state of the workspace (e.g., an expected stability of a stack of items, a packing density of the stack of items, etc.) in response to the placement of the item (e.g., the search space may be pruned to remove/rule out placements that are deemed physically unstable). The scoring function or cost function can be based at least in part on one or more of (i) an expected stability of the stack of items, (ii) a time for completion of the stack of items, (iii) a satisfaction of whether the stack of items satisfies a predefined criteria or heuristic (e.g., deformable members placed towards the top of the stack, heavy items placed towards the bottom of the stack, irregularly shaped items placed towards the top of the stack, etc.), (iv) collision avoidance or an expected collision (e.g., a determination of whether a trajectory to the placement location would lead to a collision between the item or robotic arm and another), (v) an efficiency of moving the item(s), and (vi) an indication of whether the robot is expected to be configured in an awkward pose when picking, moving, or placing the item for the placement.

In some embodiments, for each node in the tree (or Markov decision process) system 100 queries the model to determine a score or cost associated with placing the corresponding item in accordance with the placement at the node. System 100 can query a placement model(s) to simulate placement of the item corresponding to the node, and determine a score/cost based on a simulated result of the placement. System 100 traverses the tree beginning at the root node, and then following branches from the root node to higher-order levels of the tree. As system 100 reaches a particular node during traversal of the tree, system 100 queries the model to determine the score or cost associated with the corresponding placement, and determines whether to prune the particular node (and any downstream nodes that branch directly or indirectly from the particular node). For example, system 100 determines whether to prune the node based at least in part on comparing the score associated with the scoring function with a predefined scoring threshold. If the score is less than the scoring threshold, system 100 determines to prune the node.

In some embodiments, system 100 is configured to permit/enable buffering of items, and system 100 determines the search space based at least in part on the combination/permutations of placements of items, including changing an order of placement of items up to a threshold buffer amount. For example, if system 100 is configured to permit buffering of up to two items, system 100 may determine the search space based on selection, from the next three items to be placed, of the first next item to place. System 100 may determine nodes in the search space for each placement order and corresponding combinations/permutations of placement locations and orientations.

Using a machine learning model to evaluate a state of a pallet/stack of items and to simulate placements (e.g., next actions) enables system 100 to prune the search space (e.g., the tree) using machine learning techniques. In some embodiments, the machine learning model evaluates, and scores/weights potential outcomes of a placement based on historical information (e.g., what system 100 has seen before, or based on the training data for the model). The model scores a current state of the pallet/stack of items and placements, and system 100 determines the best placement (e.g., system 100 uses the respective scores to determine the best placement). The model can be trained based on simulating (e.g., simulating using a geometric model, or simulating using physical trials) various placements of various items, and providing a reward (e.g., an indication of goodness) when a simulation provides a good outcome (e.g., a stable stack of items), and a negative reward (e.g., an indication that the state of the pallet is unfavorable/infeasible) when simulation provides a bad outcome (e.g., an unstable stack of items, a stack of items having a low packing density, an irregularly shaped item being placed at or near the bottom of the stack of items, etc.). The simulation of various placements of various items includes performing simulations with different locations, orientations, and items (e.g., items having one or more different attributes), etc.

In some embodiments, in addition to, or in alternative to, using a machine learning model to bound a search space or simulate a placement of an item to determine a placement, system 100 uses one or more heuristics to quickly assess the expected impact of a placement (e.g., a change in stability of the stack of items, if any).

According to various embodiments, system 100 performs a simulation of placement for the next item (e.g., the first next item in the set of items to be placed). The simulation of the placement is used in connection with determining the first level of nodes branching from the root node (which corresponds to the current state of the pallet/stack of items). System 100 can invoke one or more simulations of placements of a set of items based on one or more placement models in connection with simulating a placement for a first-level node. For example, system 100 calls server 126 to provide a result of simulating placements for the first level nodes. Performing simulation of placement of an item is computationally expensive. For example, system 100 queries a physics engine to perform a simulation and receives a result (e.g., a model of an estimated state). Although simulation fidelity is very desirable, high-fidelity simulations of placement (e.g., determining a model of the stack of items based on such placement) are expensive (e.g., computationally expensive, time expensive, etc.).

In some embodiments, for the subsequent level of nodes (e.g., placement of items after the first next item in the set of items) system 100 uses one or more heuristics in connection with determining an expected stability of the estimated state (e.g., the stack of items). The one or more heuristics can be predefined. For example, the one or more heuristics may be defined based on a stacking policy or system preferences. The heuristics may be empirically determined by an administrator and correspondingly preset. In some embodiments, the one or more heuristics are based on an attribute of the corresponding item being logically placed (e.g., according to placement for the node) or items within the stack of items. According to various embodiments, system 100 performs a simulation of the placement of the items only for the first level of nodes branching from the root node, and for N−1 subsequent items, system 100 uses one or more heuristics to determine an expected stability, or an impact on the stability, by placement of the corresponding items according to the placement location and orientation for the respective nodes.

Examples of heuristics can include (i) an expected stability based on placement of a non-rigid or deformable item at or near the bottom of the stack of items, (ii) an expected stability based on placement of a large item at or near the top of the stack of items, (iii) an expected stability based on placement of a heavy item at or near the top of the stack of items, (iv) an expected stability based on placement of a heavy item at or near the bottom of the stack of items, (v) an expected stability based on placement of an irregularly shaped item at or near the bottom of the stack, and (vi) an expected stability based on placement of an irregularly shaped item at or near the top of the stack, etc.. Various other heuristics may be implemented. As an example, a heuristic indicates that the stack of items is unstable if a non-rigid or deformable item is placed at or near the bottom of the stack of items. As an example, a heuristic indicates that the stability of the stack of items is not negatively impacted (e.g., at least by a threshold stability amount) by placement of a non-rigid or deformable item placed at or near the top of the stack of items. As an example, a heuristic indicates that the stack of items is unstable if a heavy item is placed at or near the top of the stack of items. As an example, a heuristic indicates that the stability of the stack of items is not negatively impacted (e.g., at least by a threshold stability amount) by placement of a heavy item placed at or near the bottom of the stack of items. As an example, a heuristic indicates that the stack of items is unstable if an irregularly shaped item (e.g., a non-rectangular item, a round item, etc.) placed at or near the bottom of the stack of items. As an example, a heuristic indicates that the stability of the stack of items is not negatively impacted (e.g., at least by a threshold stability amount) by placement of an irregularly shaped item (e.g., non-rectangular) is placed at or near the top of the stack of items.

According to various embodiments, a heuristic is a computationally efficient variation of performing a physical simulation. For example, the heuristic is defined to be similar to performing a simulation of placements. The determining the stack of items and expected stability using simulated placement for the first next item (e.g., the first level of nodes branching from the root node) and using heuristics for placement of the second or more next items (e.g., the second level nodes and nodes respectively branching from the second level nodes) provides an accurate estimated state for placement of the next item and a cost effective method for populating (e.g., determining an expected stability or impact to the expected stability) the rest of the tree.

In response to traversing the search space (e.g., pruning the search space to remove unfavorable/infeasible placements), the system performs a tree search to determine the best placement. For example, system 100 performs a Monte Carlo tree search to evaluate/determine the best placement among the pruned search space.

In some embodiments, the system comprises a plurality of zones in which pallets are respectively disposed. The system can contemporaneously determine a pallet/stack of items on which a particular item is to be placed, and pick and place the item to a selected pallet.

Although the foregoing example is discussed in the context of a system palletizing a set of items on one or more pallets, the robotic system can also be used in connection with depalletizing a set of items from one or more pallets.

Figure 2:
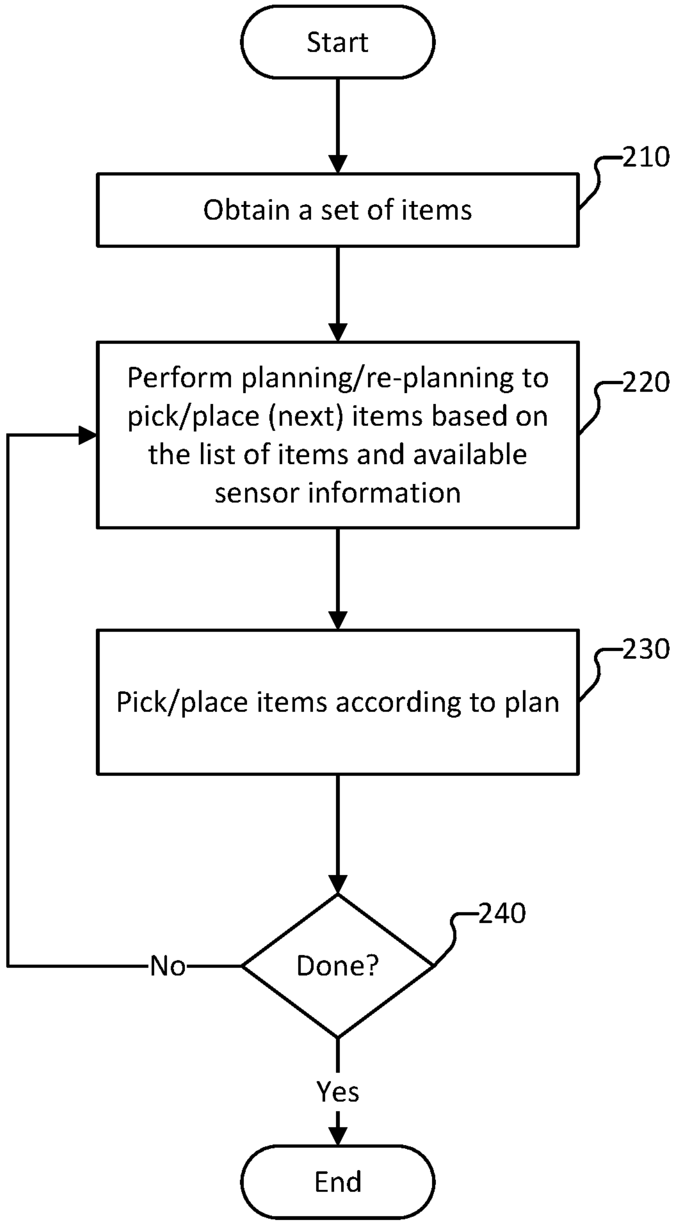
FIG. 2 is a flow chart illustrating a process to palletize one or more items according to various embodiments.

FIG. 2 is a flow chart illustrating a process to palletize one or more items according to various embodiments. In some embodiments, process 200 is implemented at least in part by system 100 of FIG. 1.

At 210, a set of items is obtained. The set of items may correspond to a set of items that are to be collectively palletized on one or more pallets. According to various embodiments, a set of items to be palletized is determined based at least in part on an indication that a manifest or order is to be fulfilled. For example, in response to receiving an order, a list of items for the order may be generated. As another example, a list of items corresponding to a plurality of orders to be sent to the same recipient may be generated.

The items may be located on a shelf or other location within a warehouse. In order to palletize the items, the items are moved to a robotic system that palletizes the items. For example, the items may be placed on one or more conveyors that move the items to within range of one or more robotic arms that palletize the items onto one or more pallets. In response to obtaining the list of items, at least of some the items are associated with a particular robotic arm, a predefined zone corresponding to the particular robotic arm, and/or a particular pallet (e.g., a pallet identifier, a pallet located into a predefined zone), etc.

At 220, planning (or re-planning) is performed to generate a plan to pick/place items based on the list of items and available sensor information. The plan may include one or more strategies for retrieving one or more items on the list of items and placing such items on the corresponding one or more conveyors to carry the items to a robotic arm. According to various embodiments, an order in which the items on the list of items are to be provided to the applicable robotic arm for palletizing is determined based at least in part on the list of items.

The order in which the items are placed on the conveyor may be at least loosely based on the items and an expected stack of the items on one or more pallets (e.g., a modeled estimated state). For example, the system that determines the order in which to place the items may generate a model of an expected stack(s) of the items (e.g., use a state estimator to determine an estimated state), and determine the order based on the model (e.g., so as to first deliver items that form the base/bottom of the stack and progressively deliver items higher up the stack). As another example, the system that determines the order in which to place the items may evaluate the state of the stack of items and placement of the items using a machine learning model, and determine the order based on performing a tree search for a scenario (e.g., sequence of items, location of items, orientations of items) that yields a best result (e.g., having a highest score for a scoring function).

In some embodiments, the system determining the order in which to place the items on the conveyor may generate a model of an expected stack(s) of the items and determine the order based on the model (e.g., so as to first deliver items that form the base/bottom of the stack and progressively deliver items higher up the stack). The system may query a machine learning model to determine the states or information pertaining to the expected stack of items (e.g., a state estimator is queried for an estimated state, or a service that simulates placement models is queried, etc.). In the case that the items on the list of items are to be palletized on a plurality of pallets, items that are expected to form the base/bottom of the respective stacks (or otherwise be relatively near the bottom of the stacks) may be placed before items that are expected to be substantially in the middle or top of the stacks. Various items that are to be palletized on the plurality of pallets may be interspersed among each other and the robotic system may sort the items upon arrival at the robotic arm (e.g., the robotic arm may pick and place the items onto an applicable pallet based at least on the item such as the identifier of the item or an attribute of the item). Accordingly, the items corresponding to the base/bottom portion of the corresponding stacks may be interspersed among each other and various items for each pallet/stack may be placed on the conveyor as the corresponding stack is built. The system may implement a tree search (e.g., a tree of a search space) to determine a sequence of items that yields a best stack of items (e.g., based on an evaluation of the expected stacks of items using a machine learning model), and the system then controls the order in which the items are to be placed on the conveyor and delivered to the robotic arm performing the palletization to generate the stack of items.

The system may generate a model of one or more expected stacks for the items belonging to the list of items. The model may be generated based at least in part on one or more thresholds such as a fit threshold value or stability threshold value, other packing metric (e.g., density), etc. For example, the computer system can generate a model of a stack of items for which an expected stability value satisfies (e.g., exceeds) the stability threshold value. The model may be generated using a machine learning process. The machine learning process may be iteratively updated based on iteratively running trials of controlling a robot to pick and place items, or on historical information such as previous stacks of items (e.g., attributes of items in previous stacks, performance metrics pertaining to the previous stacks such as stability, density, fit, etc.). In some embodiments, the model of the stack(s) for palletizing the items on the list of items is generated based at least in part on one or more attributes of the items.

Various attributes of an item may be obtained before or during the determining of the plan. Attributes may include a size of an item, a shape of an item, a type of packaging of an item, an identifier of an item, a center of gravity of an item, an indication of whether the item is fragile, an indication of a top or bottom of the item, an indication of whether the item is deformable, an indication of a rigidity of the item, etc. As an example, one or more attributes pertaining to at least a subset of the items may be obtained based at least in part on the list of items. The one or more attributes may be obtained based at least in part on information obtained by one or more sensors, and/or by performing a lookup in a mapping of attributes to items (e.g., item types, item identifiers such as serial numbers, model numbers, etc.).

In some embodiments, the generating the model of one or more expected states for the items belonging to the list of items includes generating (e.g., determining) an estimated state for the workspace (e.g., a workspace comprising one or more stacks of items). The computer system determines a plan for moving (e.g., palletizing or depalletizing, etc.) a set of one or more items, and the computer system controls a robot (e.g., a robotic arm) to move the set of one or more items according to the plan. In response to moving the set of one or more items according to the plan, the computer system determines an estimated state for the workspace. For example, the computer system updates the estimated state based at least in part on the movement of the set of items. In some embodiments, the estimated state is determined based at least in part on the geometric model or the sensor data, or a combination of the geometric model and the sensor data in response to a determination that the geometric model and the sensor data are incongruent (e.g., that a difference between the geometric model and the sensor data is greater than a predetermined difference threshold, or comprise an anomaly, etc.). The updated/current estimated state reflects the movement of the set of one or more items (e.g., in the case of palletizing, the updated estimated state includes information pertaining to the placement of the set of one or more items on the stack(s), etc.). In response to determining the updated/current estimated state, the computer system determines a plan for moving another set of one or more items, and the computer system controls the robot to move the other set of one or more items according to the plan.

In some embodiments, the system uses the current estimated state in connection with determining a next placement (e.g., a placement of a next item of a set of items to be placed). For example, the system determines a search space of possible placements for a next item based at least in part on the estimated state. In some embodiments, the system uses the estimated state as the root node of the search space (e.g., a tree structure representing the search space, or a Markov decision process, etc.), and the system determines the various combinations/permutations of a next item or a set of items (e.g., a set of N items to be placed next). Determining the placement for the next item includes invoking one or more placement models and using a physics engine to evaluate the resulting simulated stacks of items based on the placement models.

In response to determining the placement for the next item, the system determines a plan for placing the item at the corresponding destination location and associated orientation.

At 230, items are picked and moved through a (predetermined/planned) trajectory to a location near where the item is to be placed on the corresponding conveyor, and placed at the destination location according to the plan determined and/or updated at 220.

In the example shown, (re-)planning and plan implementation (220, 230) continue until the high-level objective of providing the items on the list of items is completed (240), at which the process 200 ends. In various embodiments, re-planning (220) may be triggered by conditions such as arrival of items that are not expected and/or cannot be identified, a sensor reading indicating an attribute has a value other than what was expected based on item identification and/or associated item model information, etc. Other examples of unexpected conditions include, without limitation, determining that an expected item is missing, reevaluating item identification and determining an item is other than as originally identified, detecting an item weight or other attribute inconsistent with the item as identified, dropping or needing to re-grasp the item, determining that a later-arriving item is too heavy to be stacked on one or more other items as contemplated by the original and/or current plan, and detecting instability in the set of items as stacked on the receptacle.

Figure 3:
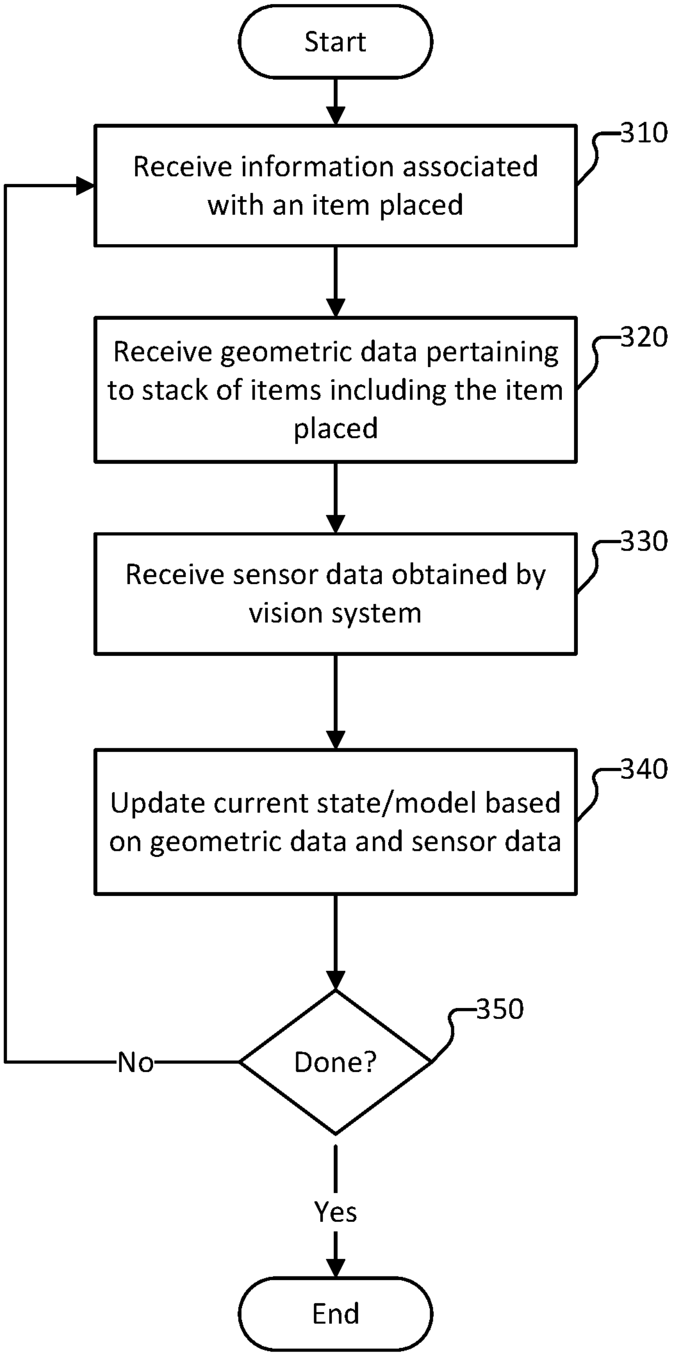
FIG. 3 is a flow chart illustrating a process to determine a model of a simulated stack of items according to various embodiments.

FIG. 3 is a flow chart illustrating a process to determine a model of a simulated stack of items according to various embodiments. In some embodiments, process 300 is implemented at least in part by system 100 of FIG. 1.

According to various embodiments, process 300 is invoked in response to a determination that the system is to determine a plan for moving one or more items. In some embodiments, process 300 is invoked with respect to placement of each of item in a set of items to be stacked. In some embodiments, process 300 is invoked at a predetermined frequency/interval, such as after a predetermined of items have been moved since a last determination of the estimated state. In addition to any of the foregoing, the system may invoke process 300 based at least in part on an attribute of an item previously placed or an item currently being placed. For example, process 300 is invoked in response to a determination that the previously placed item or current item has an irregular shape (e.g., a size/dimension exceeding a threshold size, a non-rectangular shape, etc.) and/or is deformable (e.g., the item has an expected deformability that exceeds a deformability threshold, or the item has soft packaging such as a polybag, etc.). As another example, the system invokes process 300 in response to a determination that a previously placed item or a current item to be placed may cause an instability (e.g., a threshold instability) among the stack of items.

Process 300 can be iteratively performed based on performing a plurality of state estimation models to determine an estimated state or in connection with developing the state estimation models (e.g., to select a state estimation model to use as a state estimator to palletize a set of items).

In some embodiments, the estimated state based at least in part on process 300 is used as an input to a placement model that determines one or more placements for a set of items. The placement model simulates placement of the set of items to a geometric model for the stack of item, where the geometric model corresponds to the estimated state. In connection with each placement (or each set of placements), the system invokes a physics engine to simulate the stack of items and to evaluate the stack of items (e.g., simulate external forces acting on the stack of items, simulating forces between items as an item is placed on the stack, etc.).

At 310, information associated with an item(s) placed is obtained. The system obtains the information associated with the item based on pre-stored information associated with the item (e.g., if the item is pre-known such as on a manifest of items to be palletized) or based on information obtained by the vision system (e.g., an item identifier, a size, a type of packaging, a weight, etc.). The information associated with the item placed can correspond to an attribute of the item, etc.

At 320, geometric data pertaining to a stack of items including the item placed is received. In some embodiments, the system obtains the current geometric model, which has been updated to reflect placement of the item. The current geometric model may be the estimated state used in connection with determining placement of a previous item or placement of a subset of previous items included in a set of items to which the item belongs (e.g., an expected placement based on operation of a robot to place the item(s) according to plan).

At 330, sensor data obtained by a vision system is obtained. In some embodiments, the system obtains the sensor data obtained by the vision system. For example, the system instructs the vision system to capture a current state of the workspace, and the system uses information pertaining to such capture to obtain the sensor data.

At 340, a current state or model is updated based at least in part on the geometric data and the sensor data. In some embodiments, the system uses a state estimator to determine the current state or model (e.g., to determine an estimated state). The system can query a server (e.g., a remote service) for the estimated state, and the server can implement one or more state estimation models to estimate the current state of the stack of items. The system determines an expected state based at least in part on the geometric model or the sensor data, or both the geometric model and the sensor data such as in response to a determination of a difference between the geometric model and the sensor data.

According to various embodiments, the system determines the estimated state (e.g., an updated estimated state) at least in part by performing an interpolation based on at least part of the geometric model and at least part of the sensor data. The interpolation process to be performed may be defined by the state estimator. In some embodiments, an interpolation process performed with respect to a first part of the geometric model and a first part of the sensor data to obtain a first part of the estimated state is different from an interpolation performed with respect to a second part of the geometric model and a second part of the sensor data to obtain a second part of the estimated state.

In some embodiments, the system correspondingly segments the current state, the geometric model, and/or the sensor data. For example, the system may segment the current state, the geometric model, and/or the sensor data based on predefined segment boundaries (e.g., dividing the workspace representation into a set a plurality parts with predefined sizes/shapes), or an image analysis (e.g., each item/object or subset of item/objects in the workspace are deemed to be one segment, etc.), etc.

In some embodiments, the system performs interpolation with respect to various parts of the geometric data and corresponding parts of the sensor data, and then the system stitches together the various parts to obtain a larger representation of the workspace (e.g., an estimated state for the entire workspace, or an estimated state for a set of parts of the workspace).

In some embodiments, the system uses the updated estimated state in connection with determining a plan for moving one or more items and controlling a robot to move the one or more items according to the plan.

At 350, a determination is made as to whether process 300 is complete. In some embodiments, process 300 is determined to be complete in response to a determination that no further updating of the estimated state is to be performed, no further items are to be moved, a user has exited the system, an administrator indicates that process 300 is to be paused or stopped, etc. In response to a determination that process 300 is complete, process 300 ends. In response to a determination that process 300 is not complete, process 300 returns to 310.

Figure 4:
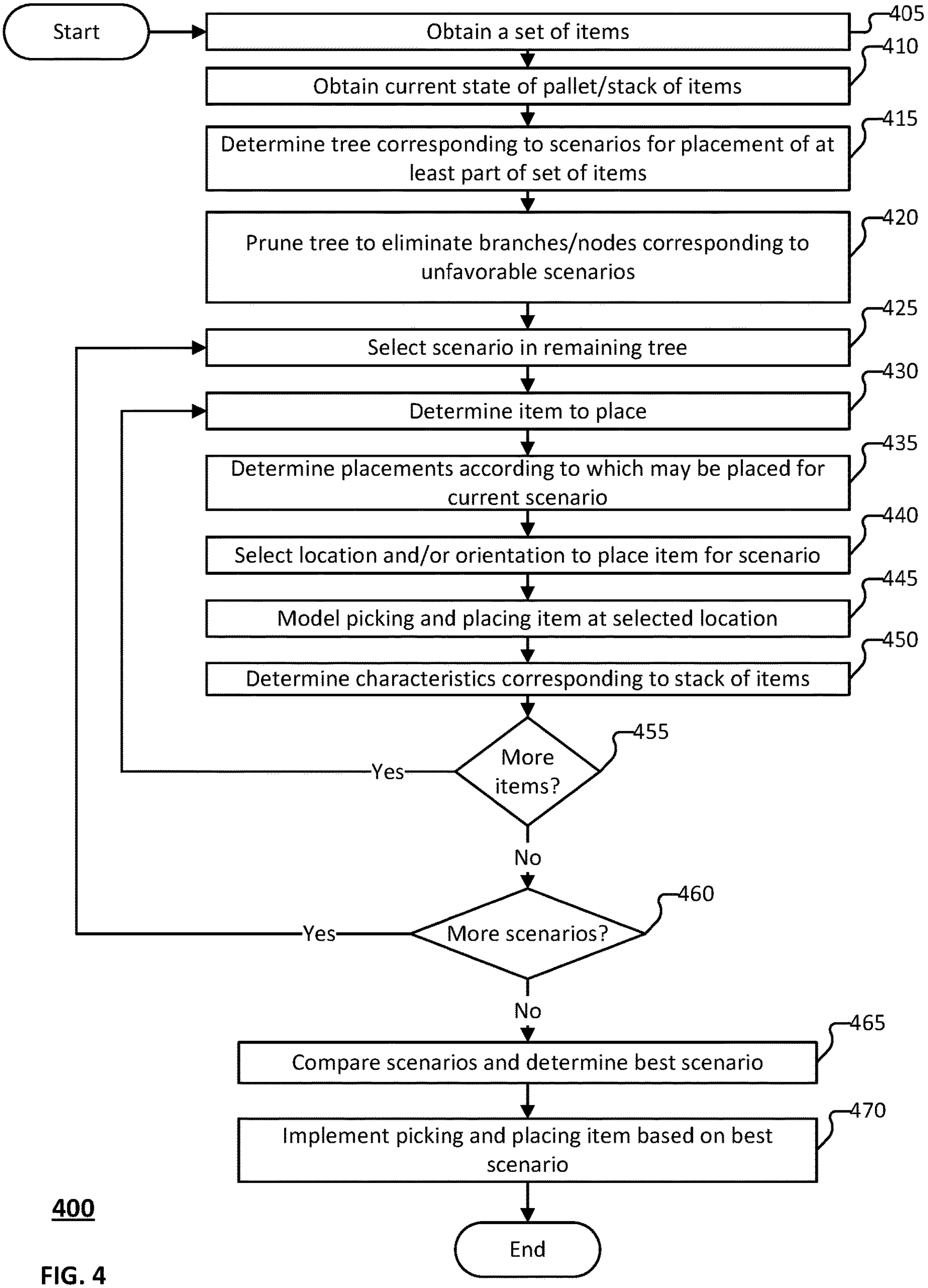
FIG. 4 is a flow chart illustrating a process to select placements of items according to various embodiments.

FIG. 4 is a flow chart illustrating a process to select placements of items according to various embodiments. In some embodiments, process 400 is implemented at least in part by system 100 of FIG. 1. According to various embodiments, process 400 is invoked in connection with determining placement(s) for a set of items. Process 400 may be used to evaluate the different placement models or scenarios to determine a placement(s) that yields a best result (e.g., a stack having a highest score for a scoring function). The system may invoke a physics engine to iteratively simulate the respective placements to obtain a resulting simulated stack of items that is evaluated.

At 405, a set of items is obtained. In some embodiments, the set of items is determined based at least in part on sensor data such as information obtained by a vision system in the workspace. The system determines the next items to be placed based at least in part on the sensor data (e.g., the system determines the next N items being delivered to the workspace for palletization, etc.). In some embodiments, the set of items is determined based at least in part on a predefined manifest or list of items that are to be picked and placed.

At 410, a current state of the pallet or stack of items is obtained. In some embodiments, the system determines a current estimated state of the pallet or stack items. The system can determine the estimated state based on using a geometric model for the stack of items, sensor data of the workspace, or a combination of the geometric model and the sensor data. For example, the system performs an interpolation with respect to the geometric model and the sensor data to determine the estimated state.

In some embodiments, the system uses a machine learning model to model the current state of the pallet or stack of items and to determine information associated with the stack of items, such as packing density, stability, time to complete placements, etc.

At 415, the system determines a tree corresponding to scenarios for placement of at least part of the set of items. In some embodiments, the system determines a search space corresponding to the various combination/permutations of placement (e.g., placement location and orientation) of the next N items.

At 420, the tree is pruned to eliminate branches and/or nodes corresponding to unfavorable scenarios. In some embodiments, 420 is performed after 450.

In some embodiments, the system determines branches/nodes corresponding to placement(s) that is expected to yield an unstable stack of items (e.g., an expected stability less than a predefined stability threshold, a heuristic indicates that the stack of items is expected to be unstable, etc.) or that the placement(s) is expected to have a cost (e.g., according to a predefined cost function) that exceeds a cost threshold. In response to determining branches/nodes corresponding to placement(s) expected to yield an unstable stack of items or a cost that exceeds a threshold cost, the system determines to prune such placements from the search space. For example, the system excludes such placements from further analysis.

In some embodiments, the system traverses the search space (e.g., the tree) and determines scenarios (e.g., nodes corresponding to placements) that yield an unfavorable/ infeasible result. The system determines that a scenario is unfavorable/infeasibility based on a determination of a score for a predetermined scoring function or a cost for a predetermined cost function. As an example, the system compares the score for a scenario to a scoring threshold, and if the score is less than the scoring threshold, the system deems the scenario as unfavorable/infeasible.

At 425, a scenario in the remaining tree is selected. In some embodiments, the system selects a combination/permutation of placements in the pruned search space. The system may iterate over 425-460 until all scenarios remaining in the pruned search space are analyzed. In some embodiments, the scenario corresponds to a node in a tree structure representing the search space. In some embodiments, the scenario corresponds to a node in a Markov decision process representing the search space.

At 430, an item to place is determined. In some embodiments, the system determines the next item to place. In some implementations, the system may permit buffering of items, and in such an implementation the system determines the next item from among the set of next items that fit within the buffer criteria.

At 435, the placements according to which the item may be placed for the current scenario are determined. The placements can correspond to the various placement locations and orientations according to which the item may be placed.

At 440, a location and/or orientation to place item for the scenario is selected. As an example, the system selects a node in the search space corresponding to placement of the item, and determines the location and/or orientation corresponding to the selected node.

At 445, picking and placing the item is modeled. In some embodiments, in response to selecting a placement of the item (e.g., determining a placement corresponding to a node in the search space), the system uses (e.g., queries) a machine learning model to model the state of the pallet/stack of items and/or the placement of the item according to the scenario. In some embodiments, the system uses the machine learning model to determine a score for the scenario (the placement of the item(s)) based on a scoring function.

At 450, one or more characteristics corresponding to the stack of items is determined. For example, the system determines the characteristics of the stack of items corresponding to the scenario based at least in part on the model of the stack of items generated based on the simulation of the placement of the item. Examples of the characteristics pertaining to the stack of items include (i) an expected stability, (ii) a cost, (iii) a time to perform the placement(s) for the scenario, (iv) an indication of whether a collision is expected to occur if the placement is performed, (v) an indication of whether the robot is expected to be positioned in an awkward or inefficient pose during placement of the item, etc.

In some embodiments, 445 and 450 are combined into a single step in which the system uses a machine learning model to determine the one or more characteristics corresponding to the stack of items in accordance with the scenario, and/or a score based on an analysis using the scoring function.

At 455, the system determines whether modelling placement of more items is to be performed. For example, the system determines whether any items in the set of items (or the set of next N items) remain to be placed according to the scenario. In response to determining that simulation of placement of more items is to be performed, process 400 returns to 430 and process 400 iterates over 430-455 until no further modelling of placement of items is to be performed for the selected scenario. In response to determining that no additional items exist, process 400 proceeds to 460.

At 460, the system determines whether additional scenarios for placement of the set of items exist. For example, the system determines whether other orders or combinations/permutations of stacking the items remain within the search space. In response to determining that additional scenarios exist, process 400 returns to 425 and process 400 iterates over 425-460 until no further scenarios exist. In response to determining that no additional scenarios exist, process 400 proceeds to 465.

At 465, the various scenarios within the search space are compared and a best scenario is determined. The system can determine the best scenario (e.g., the placement of the set of items, or of the next item, which is expected to yield a best result) based at least in part on the one or more characteristics corresponding to the stack of items for the various scenarios. For example, the system determines a placement that yields a highest expected stability. As another example, the system determines a placement that yields a lowest cost according to a predefined cost function. As another example, the system determines the best scenario to be the first placement traversed in the search for which the expected stability satisfies a stability criteria (e.g., a stability greater than a stability threshold, absence of a heuristic that would indicate the stack of items is unstable, etc.) and/or satisfies a cost criteria.

At 470, the picking and placing the item according to the best scenario is implemented. In some embodiments, the system determines a plan for placing the item based on the placement location and orientation for the scenario.

Figure 5:
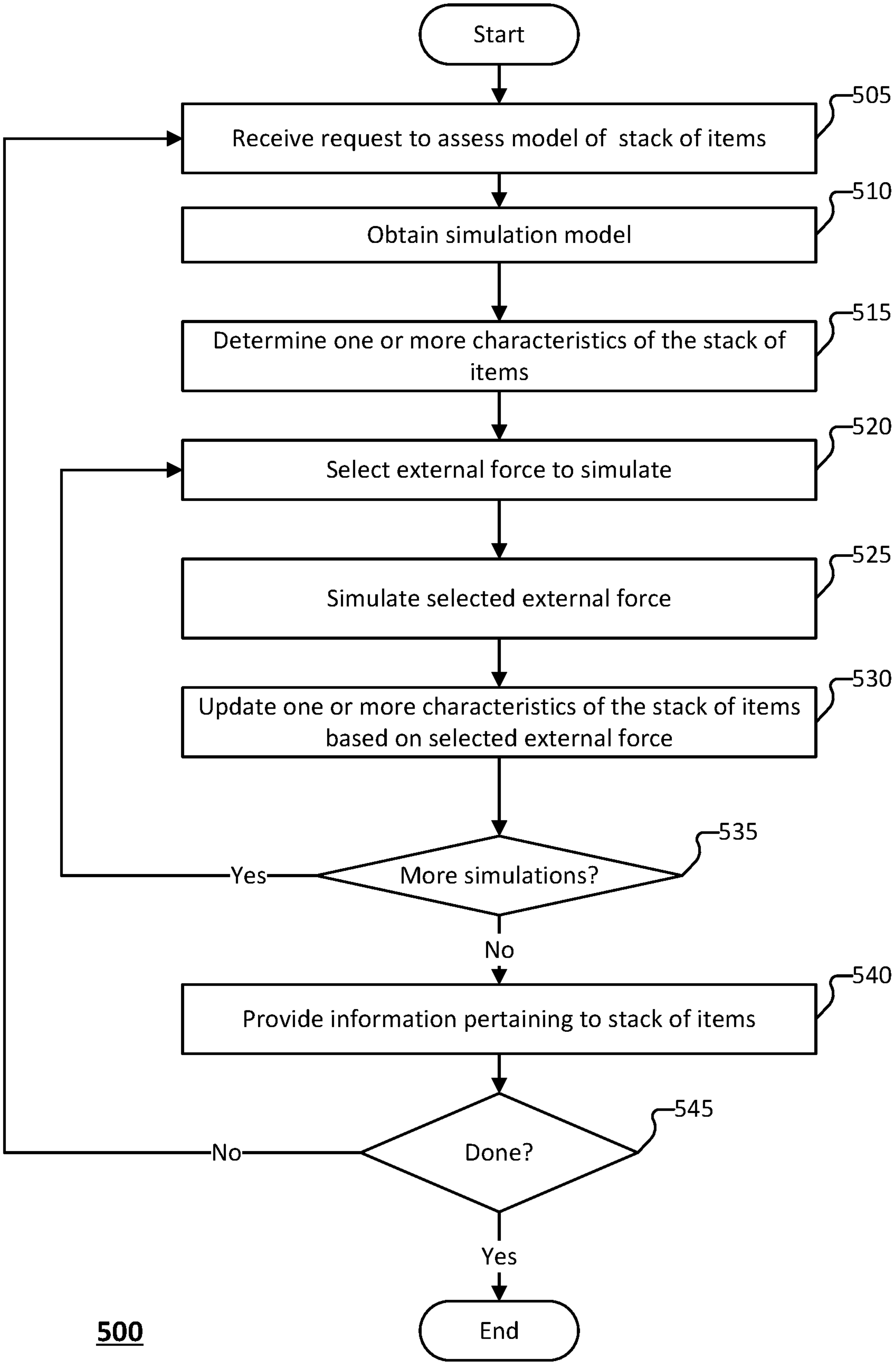
FIG. 5 is a flow chart illustrating a process to simulate interaction among items in a simulated stack of items according to various embodiments.

FIG. 5 is a flow chart illustrating a process to simulate interaction among items in a simulated stack of items according to various embodiments. In some embodiments, process 500 is implemented at least in part by system 100 of FIG. 1.

According to various embodiments, process 500 is invoked in response to the system determining a simulated placement, such as in connection with evaluating a simulated placement or simulated stack of items. Process 500 can be performed locally by a computer system (e.g., robotic system) that controls a robotic arm to pick and place items, or remotely by one or more servers that provide a service to the robotic system.

At 505, a request to assess a model of a stack of items is received. The request to assess the model of a stack of items (e.g., the estimated stack reflecting simulated placement(s) of one or more items, etc.) can be generated in response to a determination that a placement is to be simulated, or otherwise in connection with evaluating possible placements.

At 510, a simulation model is obtained. The system obtains a simulation model according to which stability of the model of the stack of items (e.g., the simulated stack of items) is simulated in response to one or more external forces being applied to the model of the stack of items.

At 515, one or more characteristics of the stack of items is determined. The system can evaluate a state of the simulated stack of items, such as determining a density, a stability, respective locations of items included in the stack of items, or attributes for one or more items included in the stack of items, etc.

At 520, an external force to be simulated is selected. The system selects an external force that is to be simulated against the simulated stack of items. For example, the system selects the external force based on a user input. A user can input selection of an external force to be modeled/simulated via a user interface provided on a client system. As another example, the system selects the external force from among a set of external forces that the obtained selection model indicates are to be simulated.

At 525, the selected external force is simulated. The system simulates applying the external force to the simulated stack of items. In some embodiments, the system invokes a physics engine that models interaction among items in the stack of items or between the external force and the stack of items (or one or more items included in the stack of items). Invoking the physics engine can include providing the physics engine with an indication of a type of force, a direction of the force, a magnitude of the force, the geometric model for the simulated stack of items, and/or information pertaining to the attributes for the items, and requesting the physics engine to simulate the application of the external force.

At 530, the one or more characteristics of the stack of items is updated based at least in part on the simulation of the selected force. In response to simulating the application of the external force to the simulated stack of items, the system evaluates the stack of items. Examples of the evaluation of the stack of items includes determining a resulting stability of the stack of items, determining locations of the various items of the simulated stack of items (e.g., to assess whether an item has fallen from the stack of items, or whether item(s) have moved within the stack of items), etc.

At 535, a determination is made as to whether additional simulations are to be performed with respect to the stack of items. In response to determining that additional simulations are to be performed at 535, process 500 returns to 520 and process 500 can iterate over 520-535 until no further additional simulations are to be performed with respect to the stack of items (e.g., using the obtained simulation model). Conversely, in response to determining that no further simulations are to be performed at 535, process 500 proceeds to 540.

At 540, information pertaining to the stack of items is provided. In some embodiments, the information pertaining to the stack of items is provided to a user, system or other module/service that invoked process 500. For example, if process 500 is invoked by a user (e.g., a client system) to simulate the stack of items, the information pertaining to the stack of items is provided to the user. As another example, if process 500 is invoked by a system or service that is determining a placement of a current/next item, process 500 provides the information pertaining to the stack of items to such system or service.

The information pertaining to the stack of items can include one or more of (i) a geometric model of the resulting stack of items (e.g., the stack of items after the simulated external force(s)), (ii) information pertaining to a stability of the stack of items, such as a stability measure computed according to a stability function, etc., (iii) a score computed for the stack of items based on a predefined scoring function, such a measure of a goodness of the stack of items (e.g., a scoring function based on stack density, stack stability, time for items to be stacked, cost for items to be stacked, etc.), (iv) an indication of whether an item has fallen from the simulated stack of items, etc.

At 545, a determination is made as to whether process 500 is complete. In some embodiments, process 500 is determined to be complete in response to a determination that no further analysis/assessment of models of stacks of items is to be performed, no further items are to be moved, a user has exited the system, an administrator indicates that process 500 is to be paused or stopped, etc. In response to a determination that process 500 is complete, process 500 ends. In response to a determination that process 500 is not complete, process 500 returns to 505.

Figure 6:
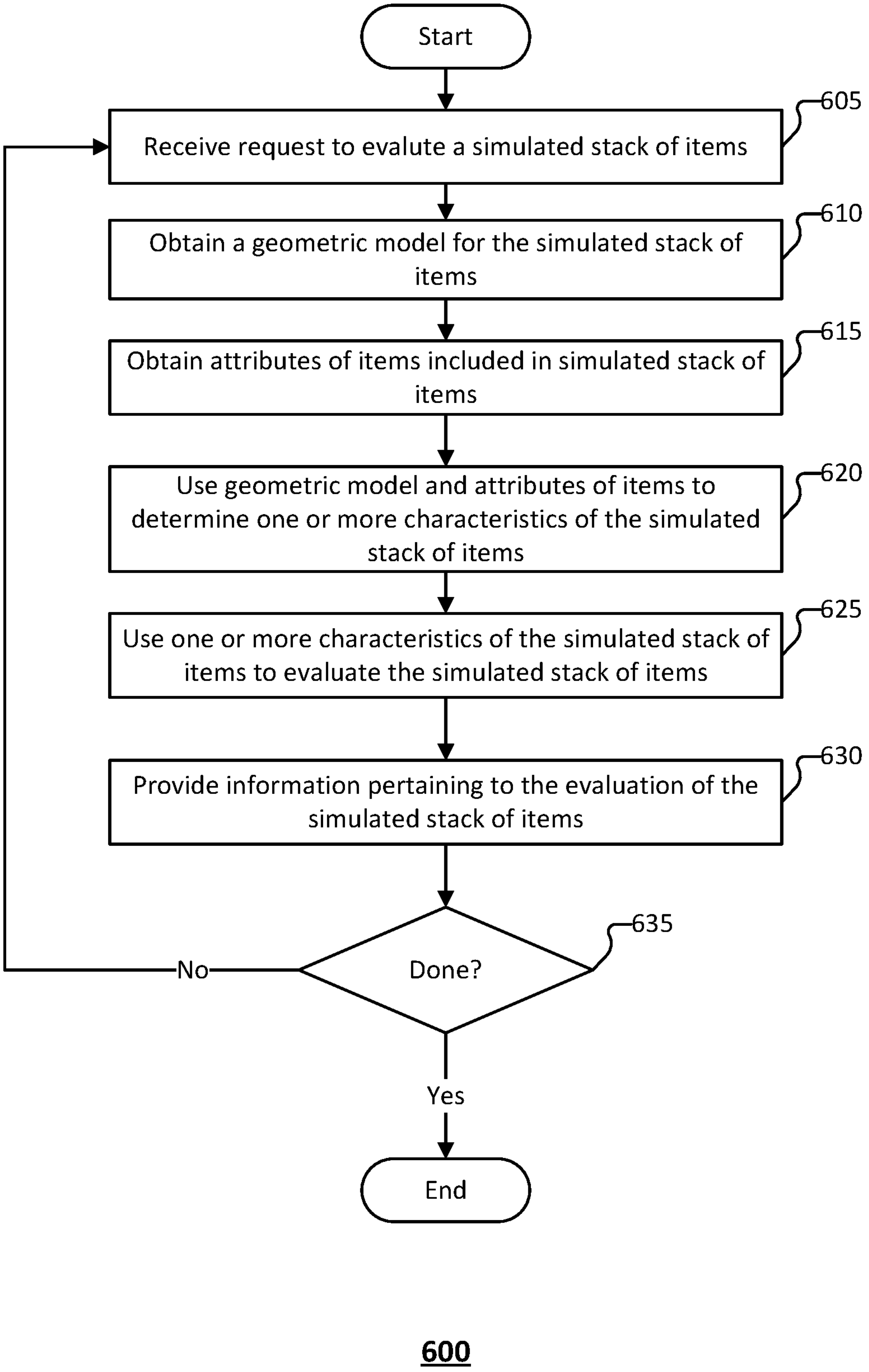
FIG. 6 is a flow chart illustrating a process to evaluate a simulated stack of items according to various embodiments.

FIG. 6 is a flow chart illustrating a process to evaluate a simulated stack of items according to various embodiments. In some embodiments, process 600 is implemented at least in part by system 100 of FIG. 1. Process 600 may be invoked in response to a determination to evaluate a stack of items. In some embodiments, process 600 is implemented by a physics engine, such as a physics engine running on a remote server or locally on a computer that controls a robotic arm.

At 605, a request to evaluate a simulated stack of items is received. In some embodiments, the system receives a request to evaluate the simulated stack of items in connection with modelling/simulating a placement. For example, the request to evaluate the simulated stack of items is used in connection with determining a placement that yields a best result (e.g., a stack having a highest score for a scoring function).

At 610, a geometric model for the simulated stack of items is obtained. The geometric model for the simulated stack of items comprises a current state of the stack of items or a geometric model updated based one or more placement of items or simulated placement of items. In the case that a first placement is being simulated, the system uses a state estimator to determine and estimated state of the stack of items (e.g., a current state of the stack of items based on a geometric model and sensor data, etc.). In the case that a placement being simulated is subsequent to one or more placements since an estimated state is obtained, the system obtains a geometric model that is determined based on the estimated state (e.g., a most recent model determined based on a combination of a geometric model and sensor data) as reflected by the one or more placements (e.g., simulated placements or actual placements).

At 615, attributes for items included in the simulated stack of items are obtained. The system obtains one or more attributes for items included in the simulated stack of items and/or items to be placed. The one or more attributes may be stored in association with the geometric model for the simulated stack of items, or the one or more attributes may be obtained based on sensor data, such as a vision system, weight sensors, etc.

At 620, the geometric model and the attributes of the items are used to determine one or more characteristics of the simulated stack of items. In some embodiments, the system uses a physics engine to evaluate the simulated stack of items based on the geometric model and the attributes of the items. The physics engine simulates interactions among items included in the stack of items, interactions caused by external forces acting on the stack of items, etc. The simulation of the interactions are used to characterize the simulated stack of items. For example, the one or more characteristics of the simulated stack of items includes a stack density, a stability, an indication of unstable or potentially unstable positions in the stack, etc.

At 625, the one or more characteristics of the simulated stack of items is used to evaluate the simulated stack of items. In some embodiments, the system analyzes the one or more characteristics of the simulated stack of items to determine whether the simulated stack of items is sufficiently good (e.g., stable, dense, etc.). For example, the system uses the one or more characteristics to compute a value (e.g., a score) according to a predefined scoring function.

At 630, information pertaining to the evaluation of the simulated stack of items is provided. The system provides a result of the evaluation. For example, the system provides an indication of the one or more characteristics of the simulated stack of items, or the score computed based on the scoring function.

At 635, a determination is made as to whether process 600 is complete. In some embodiments, process 600 is determined to be complete in response to a determination that no further models are to be evaluated, no further simulations are to be performed, a predefined amount of time to determine a placement or evaluate a placement has expired/lapsed, a user has exited the system, an administrator indicates that process 600 is to be paused or stopped, etc. In response to a determination that process 600 is complete, process 600 ends. In response to a determination that process 600 is not complete, process 600 returns to 605.

Figure 7:
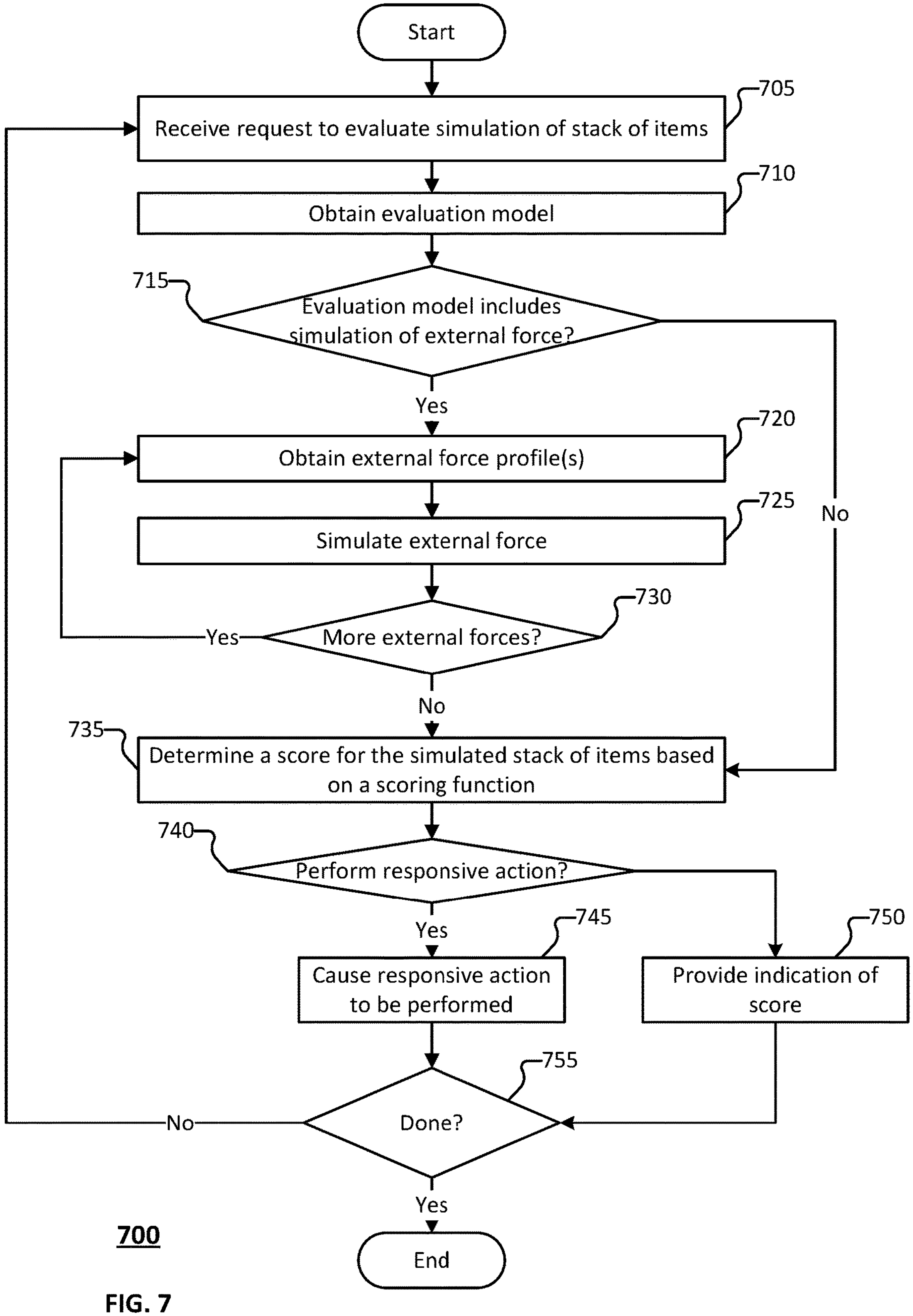
FIG. 7 is a flow chart illustrating a process to evaluate a simulated stack of items according to various embodiments.

FIG. 7 is a flow chart illustrating a process to evaluate a simulated stack of items according to various embodiments. In some embodiments, process 700 is implemented at least in part by system 100 of FIG. 1. Process 700 may be invoked in response to a determination to evaluate a stack of items.

At 705, a request to evaluate a simulated stack of items is received. In some embodiments, the system receives a request to evaluate the simulated stack of items in connection with modelling/simulating a placement. For example, the request to evaluate the simulated stack of items is used in connection with determining a placement that yields a best result (e.g., a stack having a highest score for a scoring function).

At 710, an evaluation model is obtained. The evaluation model may correspond to a scenario according to which the simulated stack of items is to be simulated or evaluated. In some embodiments, the evaluation model indicates a metric according to which the simulated stack of items is evaluated. For example, the evaluation indicates a scoring function to be used to compute a score/value indicating a goodness of the stack of items, etc. In some embodiments, the evaluation model includes an indication of one or more forces to be simulated against which the stack of items is to be evaluated. For example, the evaluation model indicates a set of one or more external forces to be applied to the stack of items. The evaluation model may indicate one or more force profiles for the external force(s) in connection with which the system evaluates the simulated stack of items. As another example, the evaluation model indicates a set of item-to-item interactions to be simulated during simulated placements, etc.

The system may store a set of one or more predefined evaluation models, or the evaluation model can be defined by a user input in connection with requesting that the simulated stack of items be evaluated.

At 715, a determination of whether the evaluation model includes simulation of an external force is made. In response to determining that the evaluation model includes simulation of one or more external forces at 715, process 700 proceeds to 720. Conversely, in response to determining that the evaluation model does not include simulation of one or more external forces at 715, process 700 proceeds to 735.

At 720, an external force profile is obtained. In response to determining that the evaluation model includes simulation of an external force, the system obtains one or more characteristics associated with the external force to be applied. The one or more characteristics may indicate a magnitude of the force, a location on the simulated stack of items at which the external force is to be applied/simulated, a direction of the external force, a type of external force, etc.

At 725, the external force is simulated. In some embodiments, the system uses a physics engine to simulate the application of the external force to the simulated stack of items. The physics engine simulates the interaction between the force and one or more items in the simulated stack of items, the interaction between items included in the stack of items, etc. The physics engine uses a model of physical interactions in the real world. The simulation of the physical interactions takes into account the various forces being applied to items and attributes for the items, etc.

At 730, a determination is made as to whether an additional external force is to be simulated. For example, the system determines whether the evaluation model includes one or more external forces that have not yet been simulated. In response to determining that an additional external force is to be simulated at 730, process 700 returns to 720 and process 700 iterates over 720-730 until no further additional external forces are to be simulated. Conversely, in response to determining that no additional external forces are to be simulated at 730, process 700 proceeds to 735.

At 735, a score of the simulated stack of items is determined based on a scoring function. The system obtains the parameters for the scoring function and the system computes a score for the scoring function. As an example, the scoring function indicates a stability of the simulated stack of items, a density of the simulated stack of items, etc.

At 740, a determination is made as to whether a responsive action is to be performed. In response to determining that a responsive action is to be performed at 740, process 700 proceeds to 745. Conversely, in response to determining that no responsive action is to be performed at 740, process 700 proceeds to 750. In some embodiments, the determination of whether a responsive action is to be performed may be based at least in part on the score according to the scoring function. For example, if a score is less than a scoring threshold, the system determines to perform a responsive action. In some embodiments, the determination of whether a responsive action is to be performed is based on a result of the simulation of the external forces. For example, in response to determining that an item has fallen off the simulated stack, the system may determine that human intervention is required to improve stability of the stack of items (e.g., to wrap the stack of items, to reposition the items within the stack of items, etc.) or to retrieve the fallen item, etc.

At 745, the responsive action is performed. In response to determining that a responsive action is to be performed, the system causes the responsive action to be performed. As an example, the responsive action to be performed can include controlling a robotic arm to perform a different placement, to reposition an item, to retrieve a fallen item, etc. As another example, the responsive action can include alerting a user, providing an indication of the lack of stability or the score of the simulated stack of items, or otherwise requesting human intervention (e.g., to retrieve a fallen item, to reposition an item(s) in the stack to improve stability or density, etc.).

At 750, an indication of the score for the simulated stack of items is provided. The indication of the score can be provided to a system or process that invoked process 700 such as a process for determining placements, or to a user such as via a user interface, etc.

At 755, a determination is made as to whether process 700 is complete. In some embodiments, process 700 is determined to be complete in response to a determination that no further models are to be evaluated, no further simulations are to be performed, a predefined amount of time to determine a placement or evaluate a placement has expired/lapsed, a user has exited the system, an administrator indicates that process 700 is to be paused or stopped, etc. In response to a determination that process 700 is complete, process 700 ends. In response to a determination that process 700 is not complete, process 700 returns to 705.

FIGS. 8A-8G are used to illustrate examples of simulating external forces to a simulated stack of items.

Figure 8A:
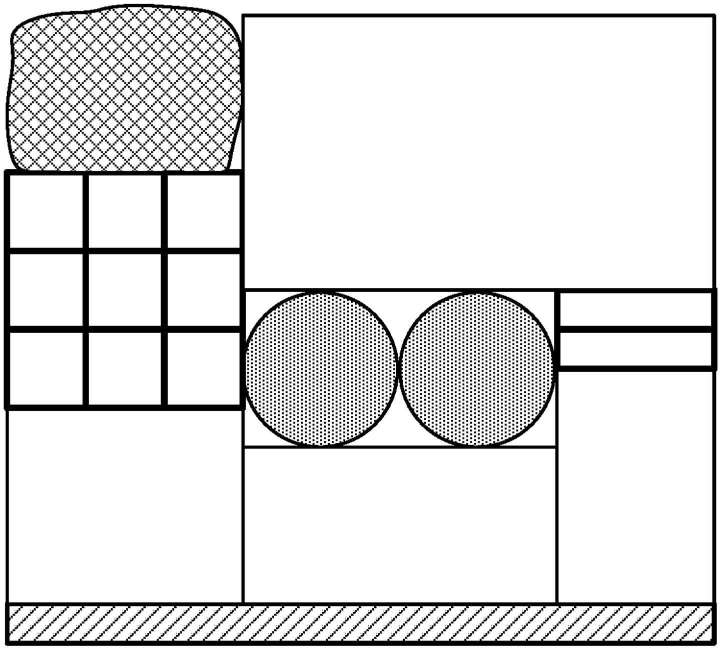
FIG. 8A is a diagram of an example stack of items based on geometric data according to various embodiments.

FIG. 8A is a diagram of an example stack of items based on geometric data according to various embodiments. Stack 800 of items corresponds to a simulated stack of items. For example, stack 800 of items is a geometric model of a set of items stacked on a pallet. The system may have generated stack 800 by simulating placement(s) of a set of items using one or more placement models.

Figure 8B:
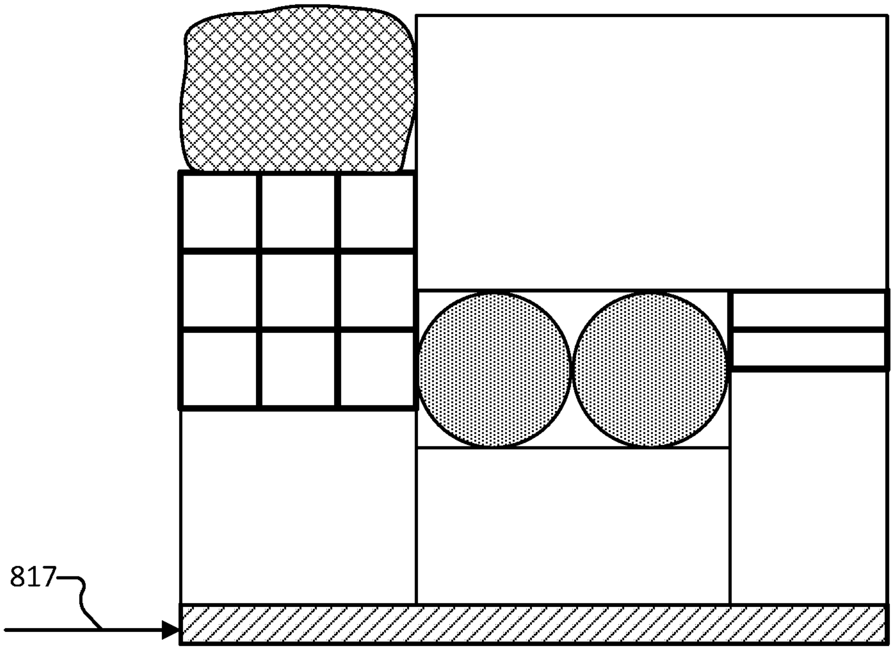
FIG. 8B is a diagram illustrating an example force applied to the stack of items according to various embodiments.

FIG. 8B is a diagram illustrating an example force applied to the stack of items according to various embodiments. External force 817 is simulated as being applied to stack 815. External force 817 can be defined based on a simulation model or a user input. In the example illustrated in FIG. 8B, external force 817 may correspond to a type/extent of force experienced by stack 815 when engaged by a forklift or other device used to move the pallet.

Figure 8C:
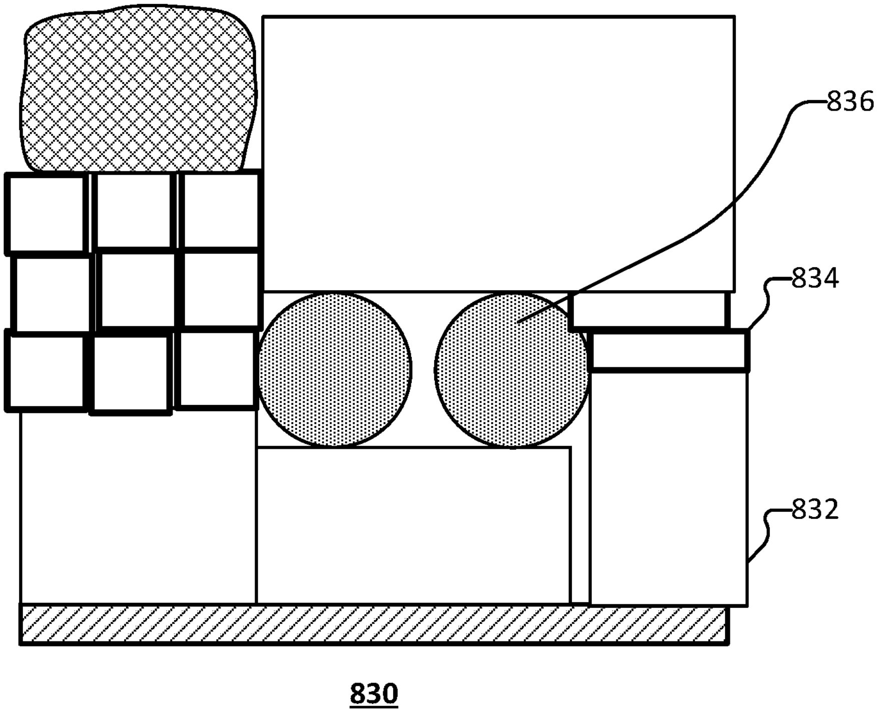
FIG. 8C is a diagram of simulated stack of items after the example force is applied to the stack according to various embodiments.

FIG. 8C is a diagram of simulated stack of items after the example force is applied to the stack according to various embodiments. Stack 830 of items is an example of a resulting stack after external force 817 is applied to stack 815. As illustrated in FIG. 8C, the system (e.g., a physics engine) simulates the interaction between external force 817 and items in stack 815 and/or interaction between items within stack 815. Stack 830, in comparison to stack 815, has several items that have moved since application of the simulated external force 817. For example, items 832, 834, and 836 are shown to have shifted in comparison to the corresponding items in stack 815.

Figure 8D:
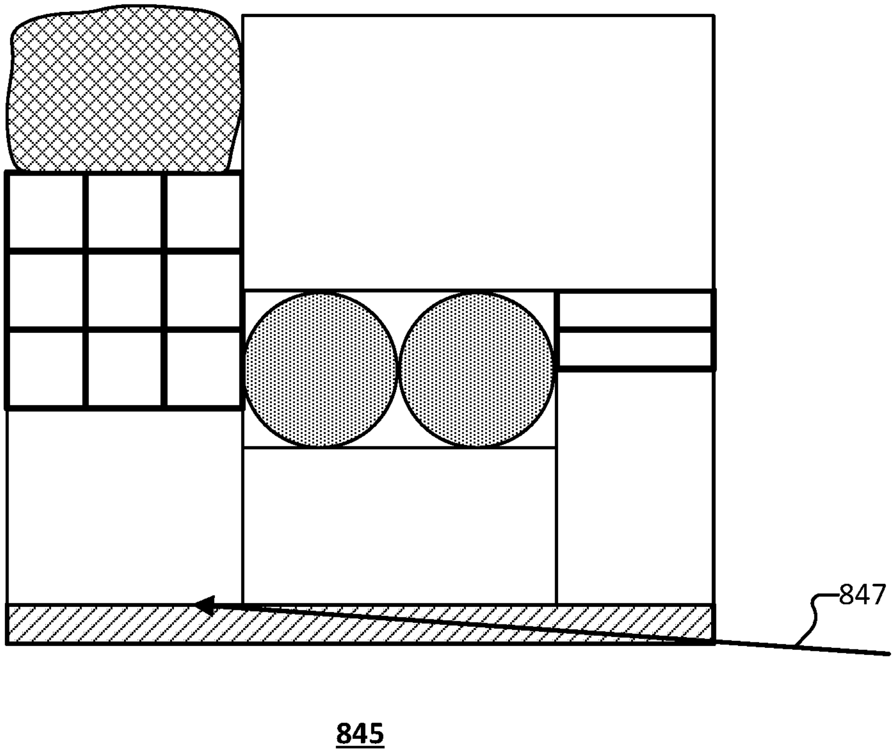
FIG. 8D is a diagram illustrating an example force applied to the stack of items according to various embodiments.

FIG. 8D is a diagram illustrating an example force applied to the stack of items according to various embodiments. External force 847 is simulated as being applied to stack 845. External force 847 can be defined based on a simulation model or a user input. In the example illustrated in FIG. 8D, external force 847 may correspond to a type/extent of force experienced by stack 845 when lifted by a forklift or other device used to move the pallet. For example, FIG. 8D illustrates external force 847 being applied to a location where the pallet, on which stack 845 is stacked, is engaged by the fork(s) of the forklift.

Figure 8E:
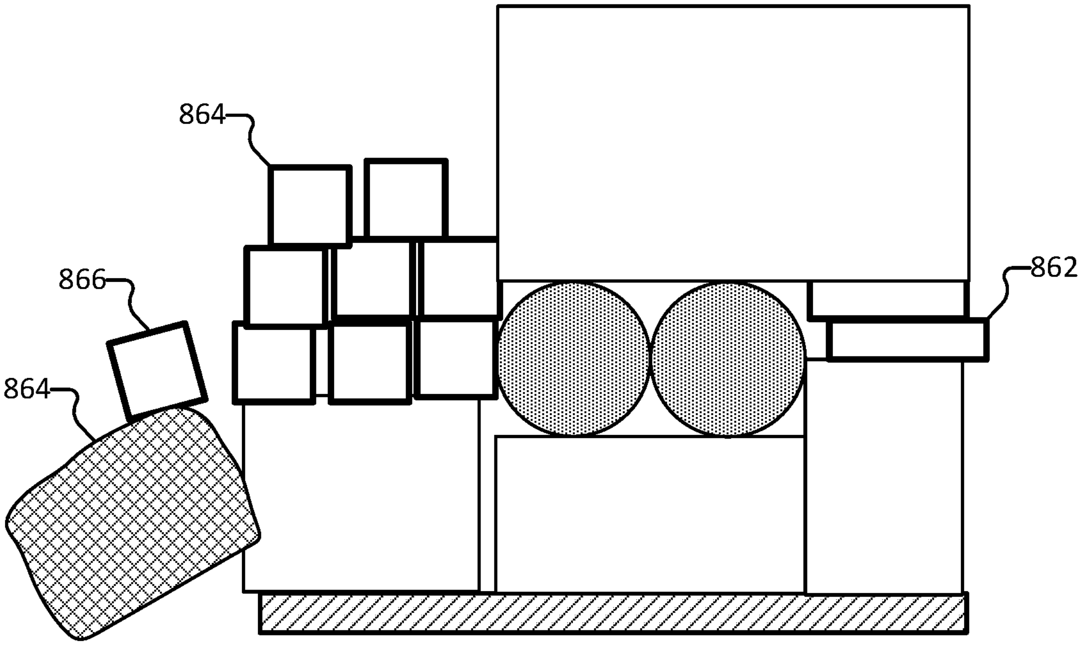
FIG. 8E is a diagram of simulated stack of items after the example force is applied to the stack according to various embodiments.

FIG. 8E is a diagram of simulated stack of items after the example force is applied to the stack according to various embodiments. Stack 860 of items is an example of a resulting stack after external force 847 is applied to stack 845. As illustrated in FIG. 8E, the system (e.g., a physics engine) simulates the interaction between external force 847 and items in stack 845 and/or interaction between items within stack 845. Stack 860, in comparison to stack 845, has several items that have moved since application of the simulated external force 847. For example, items 862 and 864 are shown to have shifted in comparison to the corresponding items in stack 845. As another example, items 864 and 866 have fallen from stack 860. In response to applying external force 847 to stack 845, the system may deem that stack 845 is not sufficiently stable based on the detection that items 864 and 866 have fallen from the stack resulting from external force 847 (e.g., stack 860).

Figure 8F:
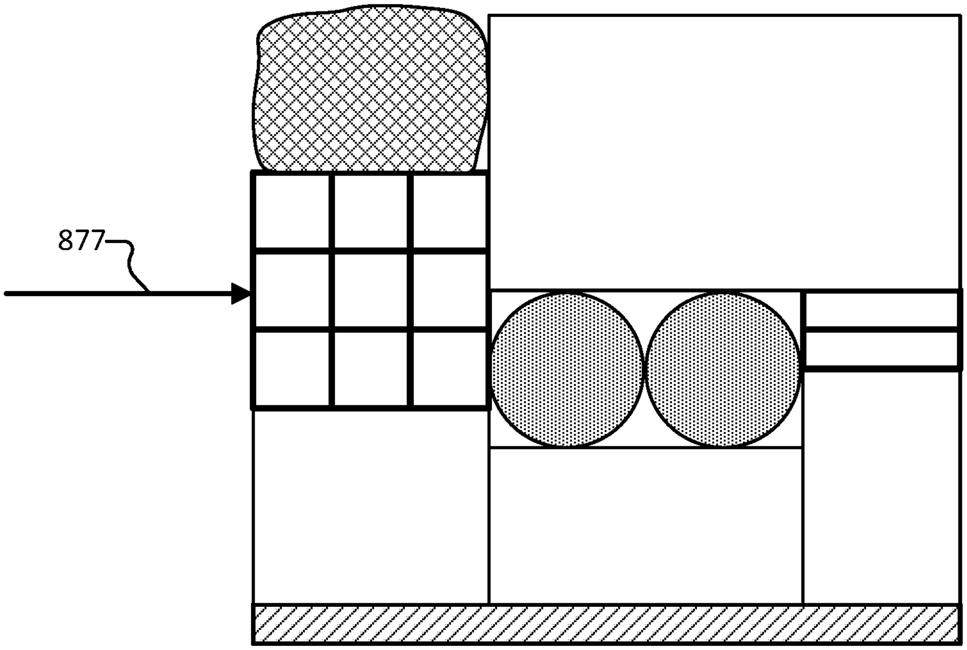
FIG. 8F is a diagram illustrating an example force applied to the stack of items according to various embodiments.

FIG. 8F is a diagram illustrating an example force applied to the stack of items according to various embodiments. External force 877 is simulated as being applied to stack 875. External force 877 can be defined based on a simulation model or a user input. In the example illustrated in FIG. 8F, external force 877 may correspond to a type/extent of force experienced by stack 875 based on a collision with an object (e.g., another item being moved by a robotic arm, a robotic arm, a person, etc.) with stack 875.

Figure 8G:
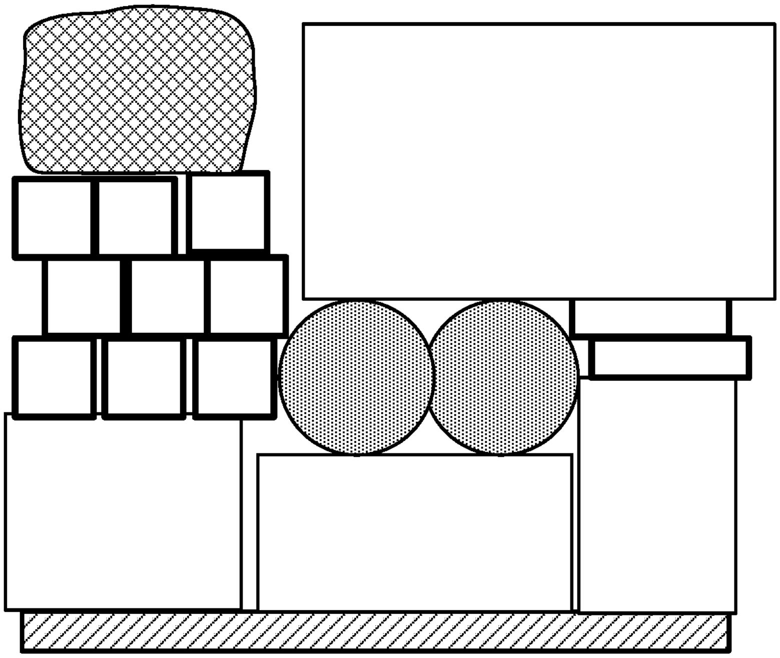
FIG. 8G is a diagram of simulated stack of items after the example force is applied to the stack according to various embodiments.

FIG. 8G is a diagram of simulated stack of items after the example force is applied to the stack according to various embodiments. Stack 890 of items is an example of a resulting stack after external force 877 is applied to stack 875. As illustrated in FIG. 8G, the system (e.g., a physics engine) simulates the interaction between external force 877 and items in stack 875 and/or interaction between items within stack 875. Stack 890, in comparison to stack 875, has several items that have moved since application of the simulated external force 877. In response to applying external force 877 to stack 875, the system may deem that stack 875 is not sufficiently stable based on the detection that items within stack 875 have not fallen from the stack and the resulting stack 890 is sufficiently stable for placement of new items, or movement of the pallet on which stack 890 is stacked, etc.

Figure 9:
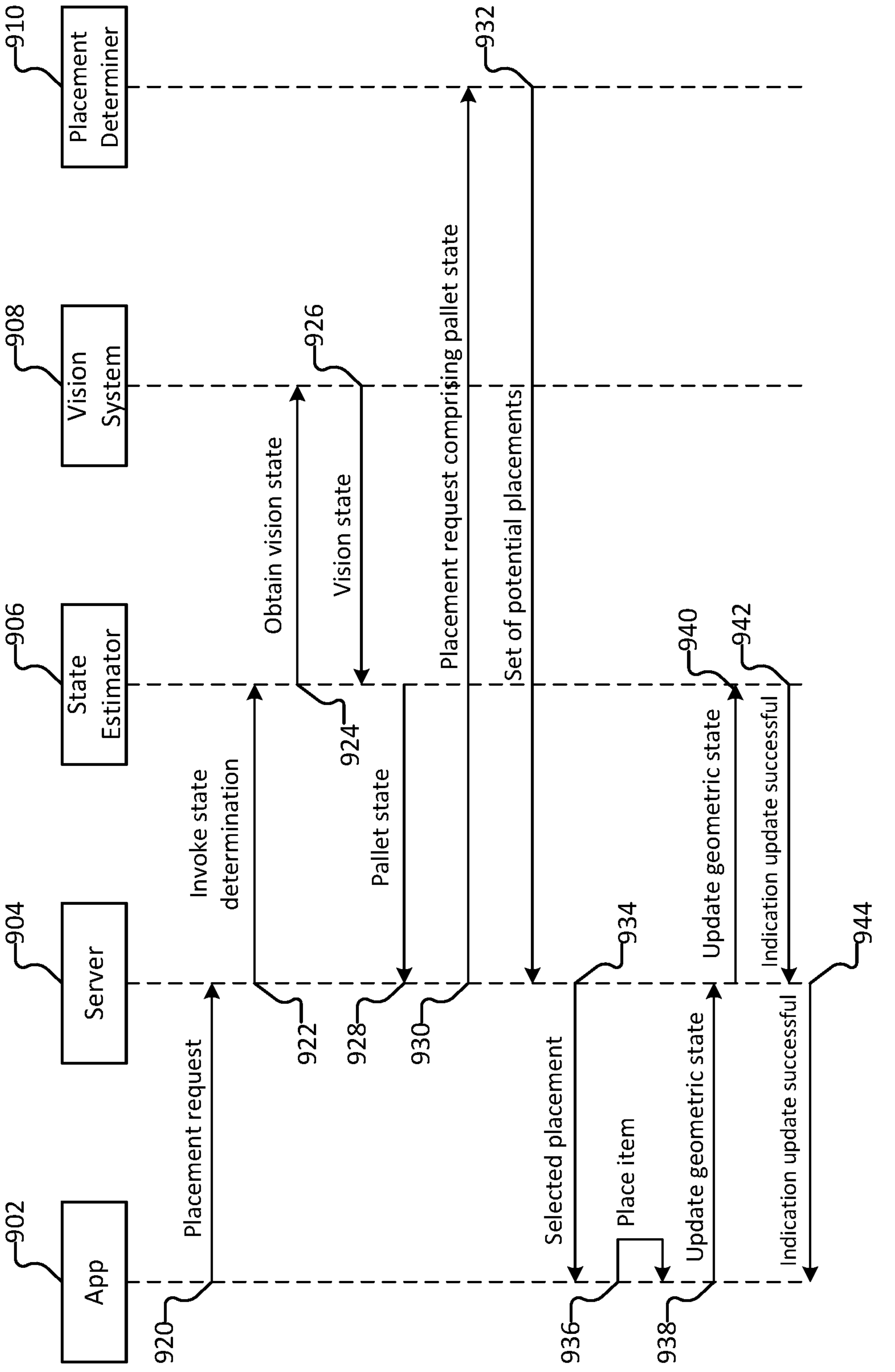
FIG. 9 is a flow diagram illustrating an embodiment of process of determining an estimate of a state of a pallet and/or stack of items.

FIG. 9 is a flow diagram illustrating an embodiment of process of determining an estimate of a state of a pallet and/or stack of items. In some embodiments, process 900 is implemented by one or more of an app 902 running on a control system for a robotic arm, server 904, state estimator 906, vision system 908, and placement determiner 910.

At 920, app 902 sends a request to server 904. The request can correspond to a placement request for a plan and/or strategy for placing an item.

In response to receiving the placement request, at 922, server 904 invokes a state determination. For example, server 904 sends a request or instruction to state estimator 906 to determine (and provide) the estimated state. In some embodiments, state estimator 906 is a module running on server 904. In some embodiments, state estimator 906 is a service that is queried by a plurality of different servers/robotic systems. For example, state estimator 906 may be a cloud service.

In response to invoking the state determination, state estimator 906 obtains the vision state. In some embodiments, state estimator 906 sends to vision system 908 a request for a vision state.

In response to receiving the request for the vision state at 924, at 926, vision system 908 provides the vision state to state estimator 906. For example, in response to receiving the request for the vision state, the vision system uses one or more sensors in a workspace to capture a snapshot of the workspace.

In response to receiving the vision state, state estimator 906 determines the pallet state (e.g., an estimated state of the pallet and/or stack of items). State estimator 906 may determine the estimated state based on one or more of a geometric model and the vision state. In some embodiments, state estimator 906 combines the geometric model and the vision state (at least with respect to a part of the stack).

At 928, state estimator 906 provides the pallet state to server 904.

At 930, server 904 sends a placement request comprising the pallet state to placement determiner 910. In some embodiments, placement determiner 910 is a module running on server 904. In some embodiments, placement determiner 910 is a service that is queried by a plurality of different servers/robotic systems. For example, placement determiner 910 may be a cloud service.

At 932, placement determiner 910 provides a set of one or more potential placements to server 904. The set of one or more potential placements may be determined based at least in part on an item(s) to be placed (e.g., attributes associated with the item) and the pallet state (e.g., available locations and attributes of items within the stack of items), etc.

In some embodiments, the set of one or more potential placements is a subset of all possible placements. For example, placement determiner 910 uses a cost function to determine the set of one or more potential placements to provide to server 904. Placement determiner 910 may determine potential placements that satisfy a cost criteria (e.g., have a cost less than a cost threshold) with respect to the cost function.

In response to receiving the set of one or more potential placements, at 934, server 904 selects a placement and sends the selected placement to app 902. For example, the selected placement is provided as a response to the initial placement request at 920.

At 936, app 902 controls a robotic arm to place the item. In some embodiments, app 902 determines a plan to move the item to the selected placement (e.g., based on an attribute(s) of the item and the location corresponding to the selected placement, such as coordinates in the workspace).

At 938, app 902 provides an indication to server 904 to perform an update with respect to the geometric state. For example, app 902 provides confirmation that the placement of the item was performed at 936 and server 904 deems such confirmation to be an indication that an update to the geometric state (e.g., geometric model) is to be invoked.

At 940, server 904 sends to state estimator 906 a request to update the geometric state. For example, server 904 requests that state estimator 906 update the geometric model to reflect placement of the item in accordance with the corresponding plan.

In response to receiving the request to update the geometric state, state estimator 906 performs the corresponding update. At 942, state estimator 906 provides an indication to server 904 that the geometric state was successfully updated.

At 944, server 904 provides to app 902 an indication that the geometric state was successfully updated to reflect placement of the item.

Process 900 may be repeated for a set of items to be stacked.

Although the foregoing examples are described in the context of palletizing or de-palletizing a set of items, various embodiments may be implemented in connection with singulating a set of items and/or kitting a set of items. For example, various embodiments are implemented to determine/estimate a state of the workspace (e.g., chute, conveyor, receptacle, etc.) based at least in part on geometric data and sensor data (e.g., a combination of the geometric data and sensor data, such as an interpolation between the geometric data and sensor data).

Various examples of embodiments described herein are described in connection with flow diagrams. Although the examples may include certain steps performed in a particular order, according to various embodiments, various steps may be performed in various orders and/or various steps may be combined into a single step or in parallel.

Although the foregoing embodiments have been described in some detail for purposes of clarity of understanding, the invention is not limited to the details provided. There are many alternative ways of implementing the invention. The disclosed embodiments are illustrative and not restrictive.

The invention claimed is:

1. A robotic system, comprising:

a memory configured to store for each of a plurality of items a set of attribute values representing one or more physical attributes of the item; and one or more processors coupled to the memory and configured to:

simulate an external force applied to a simulated stack of items, wherein simulating the external force comprises applying an adversarial scenario including a shaking force configured to accelerate destabilization of the simulated stack of items; and use the set of attribute values as inputs to a physics engine configured to compute a stability of a simulated stack of items comprising at least a subset of the plurality of items, wherein the simulated stack of items is generated in connection with simulating a candidate placement of an item in a particular location and a particular orientation, wherein the computed stability reflects the external force applied to the simulated stack of items, and wherein the physics engine is trained using a machine learning process based on a training set comprising real-world stacks of items and corresponding interactions among the real-world stacks of item;

determine whether the stability of the simulated stack is less a stability threshold; and in response to determining that the stability of the simulated stack is less than the stability threshold, cause a responsive action to be performed, wherein the responsive action comprises at least one of providing an alert to a user, causing a human intervention to be performed, determining a new plan to stack the plurality of items, or simulating a placement of the plurality of items to determine a new stack of items based on a different placement model.

2. The robotic system of claim 1, wherein the one or more processors are further configured to:

simulate iterative placement of the plurality of items on a pallet or other receptacle to obtain the simulated stack of items.

3. The robotic system of claim 1, wherein the stability is computed based at least in part on a next item to be placed or a plan to place the next item.

4. The robotic system of claim 1, wherein the stability is computed based at least in part on an interaction among at least a subset of the plurality of items.

5. The robotic system of claim 1, wherein the external force includes a shaking force.

6. The robotic system of claim 1, wherein the external force is selected based on a simulation model.

7. The robotic system of claim 1, wherein the external force is selected based at least in part on a user selection of a type or magnitude of a force to be simulated.

8. The robotic system of claim 1, wherein in response to a determination that the stability of the simulated stack of items is less than a stability threshold, a candidate placement is rejected as a placement to be performed.

9. The robotic system of claim 8, the candidate placement corresponds to a placement of one or more items in connection with which the simulated stack of items is generated.

10. The robotic system of claim 1, wherein the one or more processors are further configured to:

simulate a candidate placement of one or more items to obtain the simulated stack of items;

determine a likelihood that the simulated stack of items remains stable after the candidate placement, wherein the likelihood is determined based at least in part on output from the physics engine; and in response to determining that the likelihood that the simulated stack of items remains stable is less than a predefined likelihood threshold, reject the candidate placement.

11. The robotic system of claim 10, wherein determining the likelihood that the simulated stack of items remains stable comprises:

determining the likelihood that a computed stability of the simulated stack of items exceeds a predefined stability threshold after simulating the candidate placement.

12. The robotic system of claim 10, wherein the predefined likelihood threshold is 95%.

13. The robotic system of claim 1, wherein the responsive action comprises providing an alert to a user.

14. The robotic system of claim 1, wherein the responsive action comprises causing a human intervention to be performed.

15. The robotic system of claim 1, wherein the responsive action comprises determining a new plan to stack the plurality of items.

16. The robotic system of claim 1, wherein the responsive action comprises simulating a placement of the plurality of items to determine a new stack of items based on a different placement model.

17. The robotic system of claim 1, wherein the physics engine models multi-body interactions among the subset of the plurality of items, including at least friction, restitution, contact damping, and stiffness, to compute the stability of the simulated stack of items.

18. The robotic system of claim 1, wherein the one or more processors are further configured to:

use the physics engine to simulate stability outcomes for each of a plurality of different sequences of future placements of items; and select a placement for a current item based at least in part on the simulated stability outcome associated with at least one of the plurality of different sequences of future placements.

19. The robotic system of claim 1, wherein the one or more processors are further configured to:

in response to determining that the stability of the simulated stack is greater than a stability threshold, cause a robotic arm to place at least one item of the subset of the plurality of items according to the simulated stack.

20. The robotic system of claim 1, wherein the one or more processors are further configured to:

receive a user selection of a profile to be used in connection with simulating the stack of items, wherein the simulated stack of items is generated based at least in part on simulating one or more candidate placements of one or more items based at least in part on the profile.

21. A method to control a robot, comprising:

storing for each of a plurality of items a set of attribute values representing one or more physical attributes of the item;

simulating an external force applied to a simulated stack of items, wherein simulating the external force comprises applying an adversarial scenario including a shaking force configured to accelerate destabilization of the simulated stack of items; and using the set of attribute values as inputs to a physics engine configured to compute a stability of a simulated stack of items comprising at least a subset of the plurality of items, wherein the simulated stack of items is generated in connection with simulating a candidate placement of an item in a particular location and a particular orientation, wherein the computed stability reflects the external force applied to the simulated stack of items, and wherein the physics engine is trained using a machine learning process based on a training set comprising real-world stacks of items and corresponding interactions among the real-world stacks of items;

determining whether the stability of the simulated stack is less a stability threshold; and in response to determining that the stability of the simulated stack is less than the stability threshold, causing a responsive action to be performed, wherein the responsive action comprises at least one of providing an alert to a user, causing a human intervention to be performed, determining a new plan to stack the plurality of items, or simulating a placement of the plurality of items to determine a new stack of items based on a different placement model.

22. A computer program product to control a robot, the computer program product being embodied in a non-transitory computer readable medium and comprising computer instructions for:

storing for each of a plurality of items a set of attribute values representing one or more physical attributes of the item;

simulating an external force applied to a simulated stack of items, wherein simulating the external force comprises applying an adversarial scenario including a shaking force configured to accelerate destabilization of the simulated stack of items; and using the set attribute values as inputs to a physics engine configured to compute a stability of a simulated stack of items comprising at least a subset of the plurality of items, wherein the simulated stack of items is generated in connection with simulating a candidate placement of an item in a particular location and a particular orientation, wherein the computed stability reflects the external force applied to the simulated stack of items, and wherein the physics engine is trained using a machine learning process based on a training set comprising real-world stacks of items and corresponding interactions among the real-world stacks of items;

determining whether the stability of the simulated stack is less a stability threshold; and in response to determining that the stability of the simulated stack is less than the stability threshold, causing a responsive action to be performed, wherein the responsive action comprises at least one of providing an alert to a user, causing a human intervention to be performed, determining a new plan to stack the plurality of items, or simulating a placement of the plurality of items to determine a new stack of items based on a different placement model.

* * * * *